(12) United States Patent
Akram et al.

(10) Patent No.: US 6,400,174 B2
(45) Date of Patent: Jun. 4, 2002

(54) TEST SYSTEM HAVING ALIGNMENT MEMBER FOR ALIGNING SEMICONDUCTOR COMPONENTS

(75) Inventors: Salman Akram, Boise; Warren M. Farnworth, Nampa; Michael E. Hess, Kuna; David R. Hembree, Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/749,173

(22) Filed: Dec. 27, 2000

Related U.S. Application Data

(62) Division of application No. 09/332,838, filed on Jun. 14, 1999, now Pat. No. 6,285,203.

(51) Int. Cl.[7] .......................... G01R 31/26; G01R 31/02
(52) U.S. Cl. ....................... 324/765; 324/754; 324/758; 324/158.1
(58) Field of Search ................................ 324/754, 758, 324/765, 158.1

(56) References Cited

U.S. PATENT DOCUMENTS

| | | |
|---|---|---|
| 4,937,653 A | 6/1990 | Blonder et al. |
| 5,006,792 A | 4/1991 | Malhi et al. |
| 5,046,239 A | 9/1991 | Miller et al. |
| 5,073,117 A | 12/1991 | Malhi et al. |
| 5,088,190 A | 2/1992 | Malhi et al. |
| 5,123,850 A | 6/1992 | Elder et al. |
| 5,196,726 A | 3/1993 | Nishiguchi et al. |
| 5,289,631 A | 3/1994 | Koopman et al. |
| 5,302,891 A | 4/1994 | Wood et al. |
| 5,329,423 A | 7/1994 | Scholz |
| 5,341,564 A | 8/1994 | Akhavain et al. |
| 5,367,253 A | 11/1994 | Wood et al. |
| 5,389,873 A | 2/1995 | Ishii et al. |
| 5,408,190 A | 4/1995 | Wood et al. |
| 5,420,520 A | 5/1995 | Anschel et al. |
| 5,481,205 A | 1/1996 | Frye et al. |
| 5,483,174 A | 1/1996 | Hembree et al. |
| 5,483,741 A | 1/1996 | Akram et al. |
| 5,495,179 A | 2/1996 | Wood et al. |
| 5,500,605 A | 3/1996 | Chang |
| 5,519,332 A | 5/1996 | Wood et al. |
| 5,541,525 A | 7/1996 | Wood et al. |
| 5,559,444 A | 9/1996 | Farnworth et al. |
| 5,574,383 A | 11/1996 | Saito et al. |
| 5,578,934 A | 11/1996 | Wood et al. |
| 5,592,736 A | 1/1997 | Akram et al. |
| 5,607,818 A | 3/1997 | Akram et al. |
| 5,625,298 A | 4/1997 | Hirano et al. |
| 5,634,267 A | 6/1997 | Farnworth et al. |
| 5,686,317 A | 11/1997 | Akram et al. |
| 5,731,709 A * | 3/1998 | Pastore et al. ............... 324/760 |
| 5,739,050 A | 4/1998 | Farnworth |
| 5,756,370 A | 5/1998 | Farnworth et al. |
| 5,783,461 A | 7/1998 | Hembree |

(List continued on next page.)

*Primary Examiner*—Safet Metjahic
*Assistant Examiner*—Wasseem H. Hamdan
(74) *Attorney, Agent, or Firm*—Stephen A. Gratton

(57) ABSTRACT

A test system for testing semiconductor components includes an interconnect having contacts for making temporary electrical connections with terminal contacts on the components. The interconnect contacts can be configured to electrically engage planar terminal contacts (e.g., bond pads, test pads) or bumped terminal contacts (e.g., solder bumps, solder balls) on the components. The test system also includes an alignment member for aligning the components to the interconnect. Different embodiments of the alignment member include: a curable polymer material molded in place on the interconnect; an alignment opening formed as an etched pocket in a substrate of the interconnect; and a separate fence attached to the interconnect using an alignment fixture.

21 Claims, 11 Drawing Sheets

U.S. PATENT DOCUMENTS

| | | |
|---|---|---|
| 5,801,452 A | 9/1998 | Farnworth et al. |
| 5,807,104 A | 9/1998 | Ikeya et al. |
| 5,815,000 A | 9/1998 | Farnworth et al. |
| 5,844,418 A | 12/1998 | Wood et al. |
| 5,878,485 A | 3/1999 | Wood et al. |
| 5,915,977 A | 6/1999 | Hembree et al. |
| 5,931,685 A | 8/1999 | Hembree et al. |
| 5,962,921 A | 10/1999 | Farnworth et al. |
| 6,005,288 A | 12/1999 | Farnworth et al. |
| 6,016,060 A | 1/2000 | Akram et al. |
| 6,018,249 A | 1/2000 | Akram et al. |
| 6,025,728 A | 2/2000 | Hembree et al. |
| 6,040,702 A | 3/2000 | Hembree et al. |
| 6,072,326 A | 6/2000 | Akram et al. |
| 6,077,723 A | 6/2000 | Farnworth et al. |
| 6,078,186 A | 6/2000 | Hembree et al. |
| 6,091,251 A | 7/2000 | Wood et al. |
| 6,091,252 A | 7/2000 | Akram et al. |
| 6,094,058 A | 7/2000 | Hembree et al. |
| 6,107,109 A | 8/2000 | Akram et al. |
| 6,114,240 A | 9/2000 | Akram et al. |
| 6,121,576 A * | 9/2000 | Hembree et al. ....... 324/765 X |
| 6,130,148 A | 10/2000 | Farnworth et al. |
| 6,175,241 B1 | 1/2001 | Hembree et al. |
| 6,188,232 B1 | 2/2001 | Akram et al. |
| 6,204,678 B1 | 3/2001 | Akram et al. |
| 6,208,157 B1 * | 3/2001 | Akram et al. ................ 324/755 |
| 6,229,324 B1 * | 5/2001 | Akram et al. ................ 324/758 |
| 6,242,931 B1 | 6/2001 | Hembree et al. |
| 6,242,932 B1 | 6/2001 | Hembree |
| 6,255,840 B1 | 7/2001 | Hembree et al. |

* cited by examiner

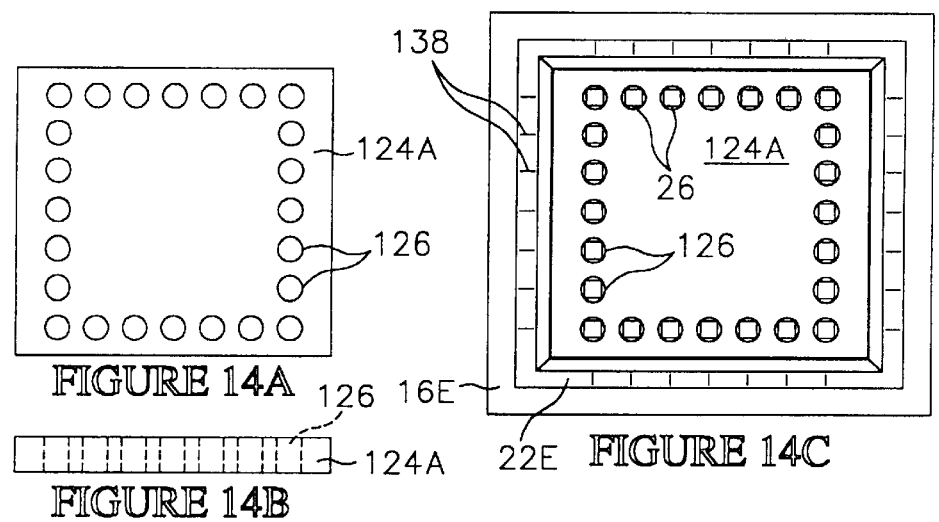
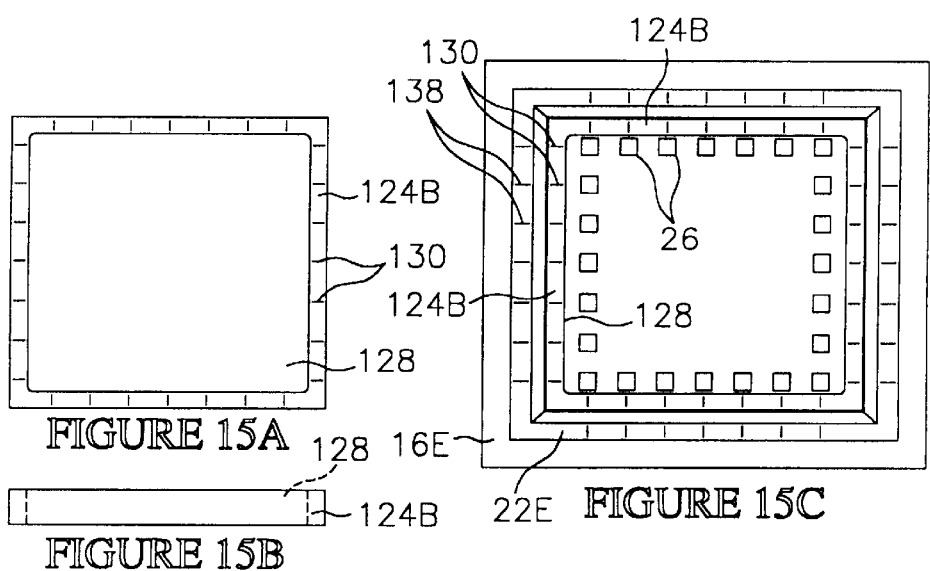
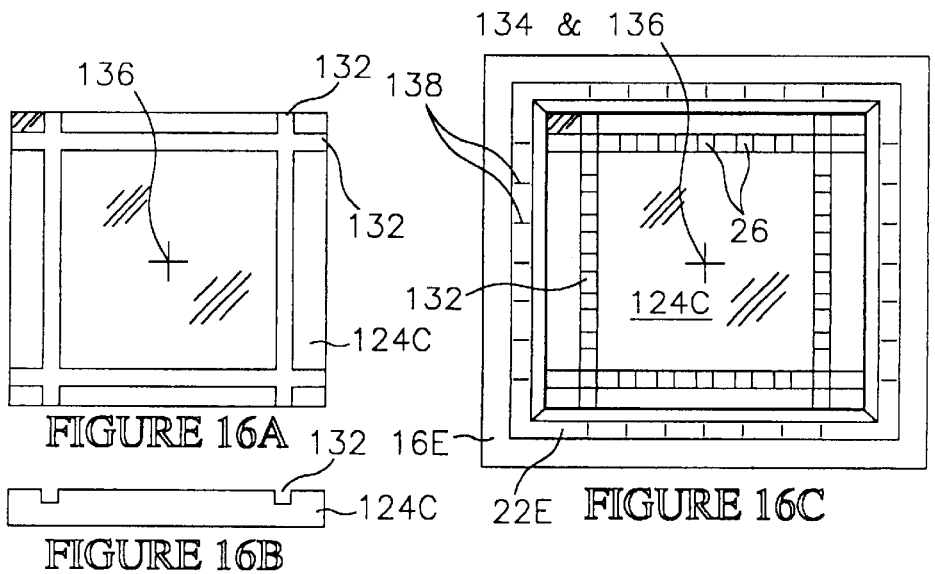

TEST SYSTEM HAVING ALIGNMENT MEMBER FOR ALIGNING SEMICONDUCTOR COMPONENTS

CROSS REFERENCE TO RELATED APPLICATIONS

This application is a division of application Ser. No. 09/332,838, filed Jun. 14, 1999, now U.S. Pat. No. 6,285,203 B1.

FIELD OF THE INVENTION

This invention relates generally to the manufacture and testing of semiconductor components. More particularly, this invention relates to a test system having an alignment member for aligning semiconductor components to an interconnect of the system.

BACKGROUND OF THE INVENTION

Due to advances in semiconductor manufacture, singulated semiconductor components, such as packages and dice, are becoming smaller, thinner, and lighter. For example, one type of semiconductor package is referred to as a "chip scale package" because it has a "footprint" (i.e., peripheral outline), and a thickness, that are about the same size as the die contained within the package. As singulated semiconductor components become smaller and lighter, it becomes more difficult to perform test procedures, such as burn-in. Testing of wafer sized components, such as wafers containing dice or chip scale packages, is also more difficult, as the wafers becoming thinner and more densely populated with individual components.

For performing test procedures on semiconductor components, test systems have been developed. The test systems include test circuitry for applying test signals to the integrated circuits contained on the components, and for analyzing the resultant signals. The test systems also include test carriers, or test boards, for retaining the components in electrical communication with the test circuitry. One type of test carrier comprises a temporary package which houses one, or more components, for mounting to a burn-in board. Alternately, test boards can be configured to directly retain multiple components in electrical communication with the test circuitry.

Representative test carriers are described in U.S. Pat. Nos. 5,519,332, 5,541,525, and 5,844,418 to Wood et al., U.S. Pat. No. 5,815,000 to Farnworth et al., and U.S. Pat. No. 5,783,461 to Hembree. A representative test board is described in U.S. Pat. No. 5,578,934 to Wood et al.

The test carriers and test boards include an interconnect for making temporary electrical connections with terminal contacts on the components. The terminal contacts on bare dice typically comprise planar aluminum bond pads, or alternately solder bumps on bond pads. The terminal contacts on chip scale packages typically comprise solder balls, arranged in a dense grid array, such as a ball grid array.

With either bumped or planar terminal contacts, the interconnects can include interconnect contacts, such as metallized recesses, or penetrating projections, that electrically engage the terminal contacts. For example, U.S. Pat. No. 5,592,736 to Akram et al. describes an interconnect with recessed contacts for electrically engaging bumped terminal contacts on unpackaged semiconductor dice. U.S. Pat. No. 5,686,317 to Akram et al. discloses an interconnect with penetrating projection contacts for electrically engaging planar terminal contacts on unpackaged semiconductor dice.

Prior to applying test signals, the components must be aligned with the interconnects, such that the interconnect contacts electrically engage the terminal contacts on the components. One method for aligning the components to the interconnects is with optical alignment techniques. With optical alignment, a viewing device can be configured to simultaneously view the interconnect contacts, and the terminal contacts. The viewing device provides feedback for manipulating vacuum tools for holding and placing the components on the interconnects. For example, an optical alignment system is described in U.S. Pat. Nos. 5,796,264 and 5,634,267 to Farnworth et al.

Although optical alignment techniques are suitable for volume semiconductor manufacture, the optical alignment systems are relatively complex, and are expensive to construct and maintain. For some applications, it may be preferable to employ mechanical alignment techniques. With mechanical alignment, an alignment member of the test system engages and aligns the components to the interconnects.

One type of alignment member includes an alignment opening, configured to engage the peripheral edges of a component. The component can be placed through the alignment opening and guided onto the interconnect. A representative mechanical alignment member is disclosed in U.S. Pat. No. 5,559,444 to Farnworth et al.

As semiconductor components become smaller, and the terminal contacts become more closely spaced, fabricating the alignment members with the required features and dimensional tolerances becomes more difficult. One problem is that the alignment members must be precisely aligned with the interconnects during fabrication of the test system. Misalignment of the alignment member with respect to the interconnect contacts during fabrication of the test system, can adversely affect the temporary electrical connections with the components during test procedures.

The present invention is directed to semiconductor test systems with improved alignment members for aligning the components. This invention also relates to fabrication process for the test systems and alignment members.

SUMMARY OF THE INVENTION

In accordance with the present invention, an improved test system for testing semiconductor components, and a method for fabricating the test system, are provided. The test system can be configured to test either singulated or wafer sized components. In either case, the test system includes an interconnect for making electrical connections with the components, and an alignment member for aligning the components to the interconnect. The interconnect includes a pattern of interconnect contacts for making temporary electrical connections with terminal contacts on the components. The alignment member guides the components onto the interconnect, such that the interconnect contacts electrically engage the component contacts.

The interconnect contacts are configured to electrically engage either bumped or planar component contacts. For engaging bumped contacts, the interconnect contacts can comprise metallized recesses, or alternately metallized projections for penetrating the bumped contacts. In addition, the projections can be formed within the recesses such that the bumped contacts are centered by the recesses. For planar contacts, the interconnect contacts can comprise metallized projections configured to penetrate the planar contacts to a self limiting penetration depth.

Several different embodiments of the alignment member are provided. In a first embodiment, a polymer alignment member comprises a curable polymer material formed directly on the interconnect. The polymer alignment member includes a peripheral alignment opening for engaging the peripheral edges of a component under test. The polymer alignment member can also encapsulate and protect wire bonded wires, or other electrical paths, to the interconnect.

A method for fabricating the polymer alignment member includes the steps of: forming a mold on the interconnect, depositing a curable polymer in viscous form on the interconnect and mold, curing the polymer, and then removing the mold. Alternately, a photoimageable material, such as a thick film resist, can be deposited on the interconnect, photo-patterned, developed to form the alignment openings, and then cured. Optionally, the polymer alignment member can also include a pattern of fine alignment openings configured to center the component contacts with respect to the interconnect contacts to provide fine alignment.

In a second embodiment, the interconnect includes an etched alignment member formed integrally with a substrate of the interconnect. In this embodiment, the interconnect substrate comprises an etchable material, such as silicon or ceramic, and the alignment member comprises a pocket etched part way through the substrate. The pocket has a peripheral shape that matches a peripheral outline of the component, and a sloped sidewall for engaging an edge of the component. In addition, the pocket includes a planar surface on which the interconnect contacts are located. As with the previous embodiment, the interconnect contacts can comprise metallized recesses, or metallized projections for penetrating the component contacts. The projections can also be placed within recesses, such that the recesses center the component contacts onto the projections. One advantage of this embodiment is that alignment of the alignment member and interconnect contacts is performed using semiconductor fabrication techniques, such as masking and etching, and is therefore "fab" aligned.

A method for fabricating the etched alignment member includes the steps of: providing a substrate, etching a pocket in the substrate comprising a sidewall for engaging an edge of the component and a planar surface, forming interconnect contacts on the planar surface within the pocket, and then forming conductive vias in the substrate to the interconnect contacts.

In a third embodiment, an alignment member comprises a separate member that is attached to the interconnect. For attaching the separate alignment member to the interconnect, an alignment fixture is provided. The alignment fixture has a peripheral outline and thickness that are identical to the components being tested. In addition the alignment fixture includes alignment features such as holes, alignment marks, grooves or alignment fiducials, that allow precise alignment to the interconnect. With the alignment fixture simulating the component and aligned with the interconnect, the separate alignment member can be aligned with the alignment fixture and attached to the interconnect. The alignment fixture is then removed to allow performing of the test procedures.

Also with the separate alignment member bond wires to the interconnect can be encapsulated in a curable polymer. In addition, the interconnect can include dummy bond wires, and dams, which prevent the encapsulant from flowing onto the interconnect contacts, and onto the area occupied by the alignment member.

In a fourth embodiment the test system includes an assembly fixture for aligning the interconnect during assembly of the test system.

In a fifth embodiment the alignment member comprises a separate member configured to align the component and to provide bond wire protection.

BRIEF DESCRIPTION OF THE DRAWINGS

FIG. 14A is a plan view of an alignment fixture for aligning the alignment member of FIG. 13A during assembly of the test system;

FIG. 14B is a side elevation view of FIG. 14A;

FIG. 14C is a plan view of the alignment fixture of FIG. 14A during alignment of the alignment member of FIG. 13A;

FIG. 15A is a plan view of an alternate embodiment alignment fixture for aligning the alignment member of FIG. 13A during assembly of the test system;

FIG. 15B is a side elevation view of FIG. 15A;

FIG. 15C is a plan view of the alignment fixture of FIG. 15A during alignment of the alignment member of FIG. 13A;

FIG. 16A is a plan view of an alternate embodiment transparent alignment fixture for aligning the alignment member of FIG. 13A during assembly of the test system;

FIG. 16B is a side elevation view of FIG. 16A;

FIG. 16C is a plan view of the alignment fixture of FIG. 16A during alignment of the alignment member of FIG. 13A;

DETAILED DESCRIPTION OF THE PREFERRED EMBODIMENTS

Referring to FIGS. 1A–1F, various prior art semiconductor components that can be aligned and tested using an alignment member, and a test system, constructed in accordance with the invention are illustrated. As used herein, the term "semiconductor component" refers to an electronic component that includes a semiconductor die. Exemplary semiconductor components include bare semiconductor dice, chip scale packages, semiconductor wafers containing multiple dice, wafers or panels containing multiple chip scale packages, ceramic semiconductor packages, plastic semiconductor packages, circuit boards containing semiconductor dice, and electronic assemblies such as field emission displays containing semiconductor dice.

Figure 1A:
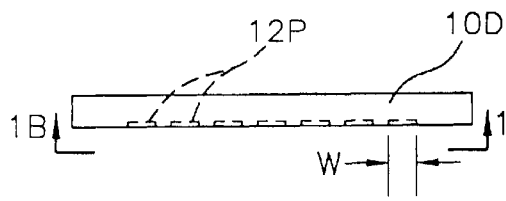
FIG. 1A is an enlarged side elevation view of a prior art semiconductor component in the form of a semiconductor die with planar terminal contacts.
Figure 1C:
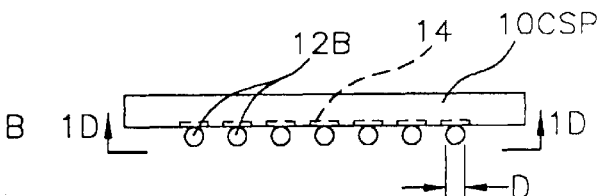
FIG. 1C is an enlarged side elevation view of a prior art semiconductor component in the form of a chip scale package with bumped terminal contacts.
Figure 1B:
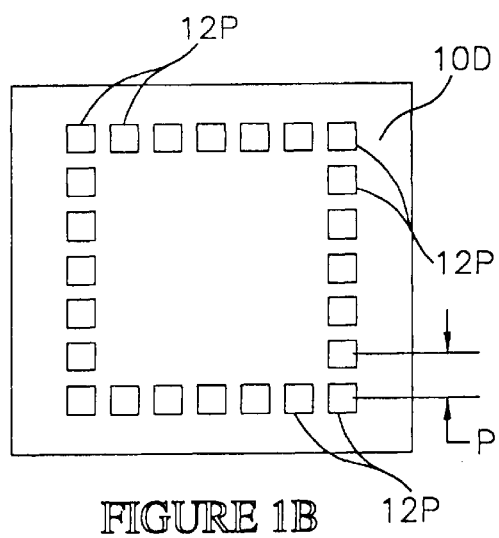
FIG. 1B is an enlarged bottom view of the component taken along section line 1B—1B of FIG. 1A.

In FIGS. 1A and 1B, a semiconductor component 10D comprises a bare die having planar terminal contacts 12P. The planar terminal contacts 12P are in electrical communication with integrated circuits contained on the semiconductor component 10D. The planar terminal contacts 12P allow electrical access from the outside to the integrated circuits on the component 10D. The planar terminal contacts 12P can comprise thin film bond pads or test pads, thin or thick film land pads, or other planar elements formed on a surface of the component 10D. The planar terminal contacts 12P have a width W (FIG. 1A) and a pitch P (FIG. 1B). In addition, the planar terminal contacts 12P are formed in a spaced array along the peripheral edges of the component 10D. Alternately, other patterns can be provided for the planar terminal contacts 12P, such as along a center line of the component 10D, or along opposite edges of the component 10D. As another example, the planar terminal contacts 12P can be formed in a dense grid pattern of columns and rows.

Each of the planar terminal contacts 12P provides a different electrical path to the integrated circuits contained on the component 10D. For example, some of the planar terminal contacts 12P provide electrical paths for applying input signals and control signals to the integrated circuits. Other planar terminal contacts 12P provide electrical paths for receiving output signals from the integrated circuits.

Figure 1D:
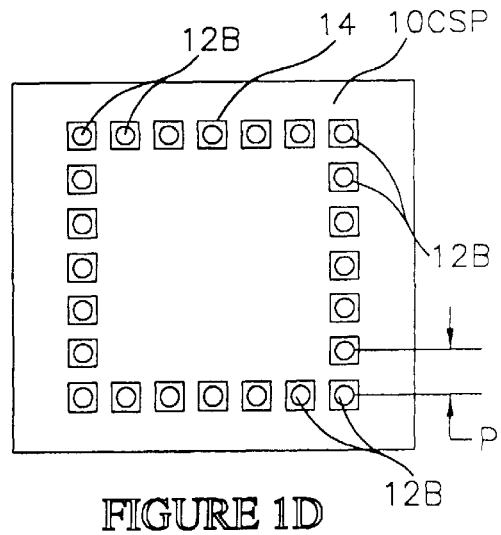
FIG. 1D is an enlarged bottom view of the component taken along section line 1D—1D of FIG. 1C.

In FIGS. 1C and 1D, a prior art semiconductor component 10CSP comprises a chip scale package having bumped terminal contacts 12B. As with the planar terminal contacts 12P (FIG. 1B), the bumped terminal contacts 12B are in electrical communication with the integrated circuits contained on the component 10CSP. In addition, the bumped terminal contacts 12B are arranged in a similar spaced array along a periphery of the component 10CSP. Alternately, the bumped terminal contacts 12B can be arranged in other patterns such as a dense grid array (e.g., ball grid array).

As shown in FIG. 1C, the bumped terminal contacts 12B can comprise metal balls, such as solder balls, attached to pads 14 on the component 10CSP. Alternately, the bumped terminal contacts 12B can have any conventional shape that provides a raised contact surface. By way of example, representative shapes include truncated spherical, hemispherical, dome, bump and conical. In addition, the bumped terminal contacts 12B have a diameter D and a pitch "P". A representative range for the diameter D (and for the width W of planar terminal contacts 12P-FIG. 1B) can be from about 0.127 mm (0.005 inch) to 0.762 mm (0.030 inch). A representative range for the pitch P can be from about 0.228 mm (0.008 inch) to 2.0 mm (0.078 inch).

Figure 1E:
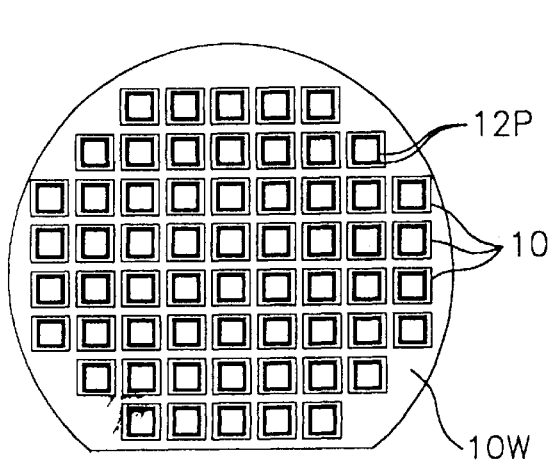
FIG. 1E is a plan view of a prior art semiconductor component in the form of a semiconductor wafer containing multiple semiconductor dice.

In FIG. 1E, a prior art semiconductor component 10W comprises a wafer containing multiple components 10D, such as the bare semiconductor dice previously described. The components 10D can be fabricated on the wafer sized component 10W using known processes, and then singulated by sawing, shearing or other suitable process. Prior to singulation, testing of the components 10D can be accomplished using an alignment member and test system constructed in accordance with the invention.

Figure 1F:
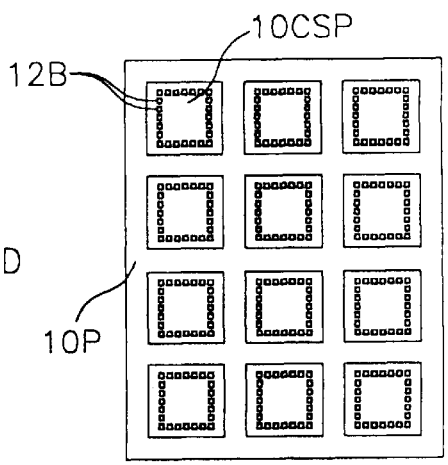
FIG. 1F is a plan view of a prior art semiconductor component in the form of a panel containing multiple chip scale packages.

In FIG. 1F, a prior art semiconductor component 10P comprises a panel containing multiple components 10CSP, such as the chip scale packages previously described. The components 10CSP can be fabricated on the panel sized component 10P using known processes, and then singulated into individual units. Prior to the singulation process, testing of the components 10CSP can be accomplished using an alignment member and test system constructed in accordance with the invention.

Figure 2:
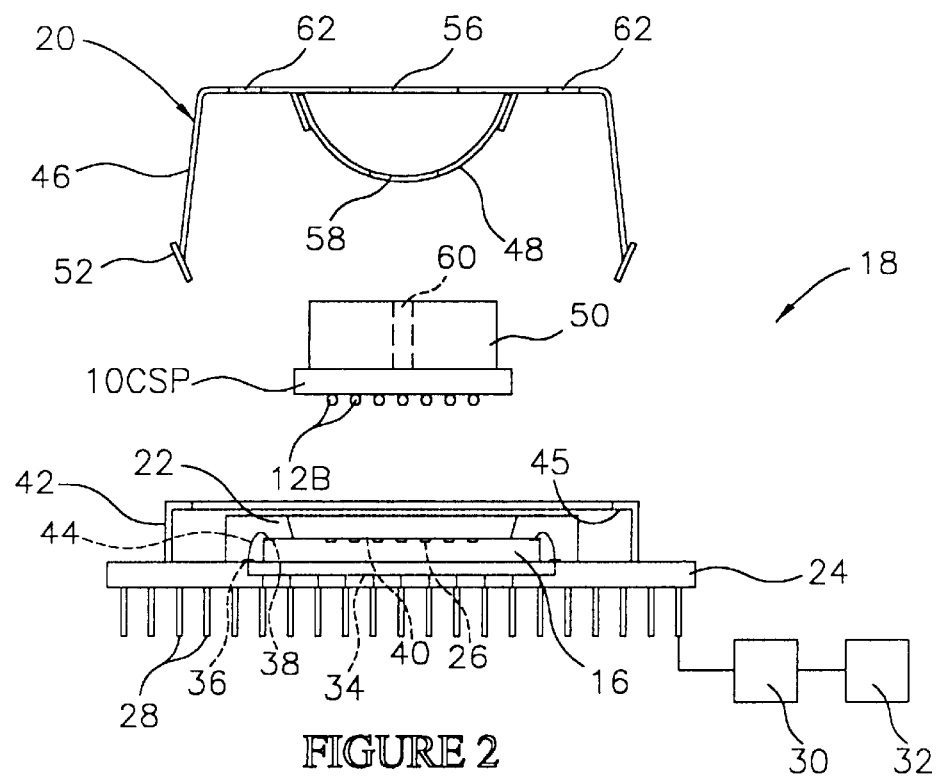
FIG. 2 is an exploded side elevation view of a test system constructed in accordance with the invention.
Figure 3:
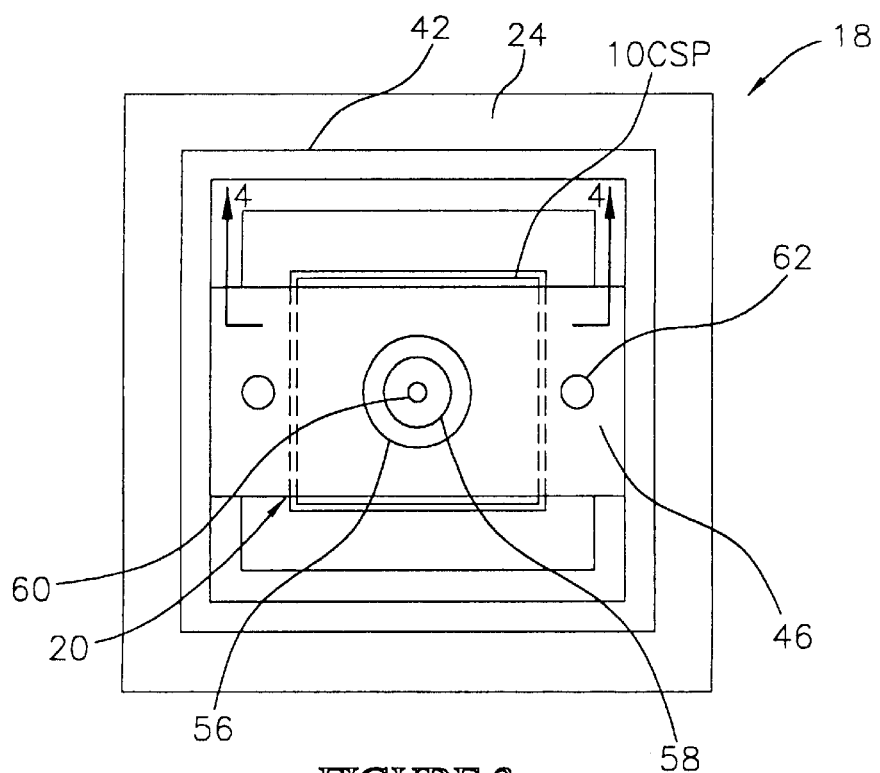
FIG. 3 is a plan view of the assembled test system of FIG. 2.

Referring to FIGS. 2 and 3, a test system 18 constructed in accordance with the invention is illustrated. The test system 18 is adapted to temporarily package the semiconductor component 10CSP with bumped terminal contacts 12B for testing and burn-in. Alternately, the test system 18 can be constructed to test the semiconductor component 10P (FIG. 1A) with planar terminal contacts 12P (FIG. 1A).

The test system 18 includes: a base 24; an interconnect 16 on the base 24 for establishing electrical communication with the component 10CSP; a force applying mechanism 20 attached to the base 24 for biasing the component 10CSP against the interconnect 16; a polymer alignment member 22 on the interconnect 16 for aligning the component 10CSP to the interconnect 16; and test circuitry 32 for applying test signals to the integrated circuits contained on the component 10CSP.

The base 24 provides a support structure for the interconnect 16 and the force applying mechanism 20. In addition, the base 24 provides an electrical interface between the interconnect 16 and the test circuitry 32. The base 24 can comprise a rigid, electrically-insulating material, such as ceramic, plastic, or a glass filled resin. For example, a ceramic lamination process can be used to fabricate the base 24 with a desired geometry, and with metal features, such as internal conductors and external pads. U.S. Pat. No. 5,519,332 entitled "CARRIER FOR TESTING AN UNPACKAGED SEMICONDUCTOR DIE", and U.S. Pat. No. 5,878,485 entitled "METHOD FOR FABRICATING A CARRIER FOR TESTING UNPACKAGED SEMICONDUCTOR DICE", which are incorporated herein by reference, describe a ceramic lamination process for fabricating the base 24.

Alternately, rather than ceramic, the base 24 can comprise molded plastic formed using a 3-D molding process. The above incorporated U.S. Pat. Nos. 5,519,332 and 5,878,485 describe a 3-D molding process for fabricating the base 24. Rather than ceramic or molded plastic, the base 24 can comprise a glass reinforced plastic (e.g., FR-4) similar to materials used for printed circuit boards. In this case, conventional plastic substrate fabrication processes, as described in *Ball Grid Array Technology*, by John H. Lau, McGraw-Hill, Inc., 1995, can be used for fabricating the base 24.

The base 24 includes terminal contacts 28 which are configured for electrical communication with a test apparatus 30 (FIG. 2) in electrical communication with the test circuitry 32 (FIG. 2). The test apparatus 30 can comprise a test board, such as a burn-in board, having one or more sockets for electrically engaging the terminal contacts 28 on the base 24. The test circuitry 32 generates test signals, and transmits the test signals through the test apparatus 30 to the terminal contacts 28 and then through the interconnect 16 to the component 10CSP. The test circuitry 32 also analyzes test signals transmitted from the component 10CSP to the test circuitry 32. This permits various electrical characteristics of the component 10CSP to be evaluated. For some applications, the test circuitry 32 can be included in a tester specifically designed for testing semiconductor components. Suitable testers are commercially available from Teradyne of Boston, Mass., as well as other manufacturers.

The terminal contacts 28 on the base 24 comprise pins formed in a pin grid array (PGA). Alternately, other configurations for the terminal contacts 28 can be provided such as ball contacts in a ball grid array (BGA), or fine ball grid array (FBGA). As another alternative, the base 24 can include pins in other shapes, such a j-bend or butt joint.

As also shown in FIG. 2, the base 24 includes terminal conductors 34 in electrical communication with the terminal contacts 28 and with bonding pads 36 on the base 24. The terminal conductors 34 can include internal portions formed within the structure of the base 24, and also external portions formed on exposed surfaces of the base 24. The internal portions of the terminal conductors 34 can be formed using processes such as via filling, lamination and molding. The external portions of the terminal conductors 34 can be formed using a metallization process, such as deposition, photopatterning and etching.

The interconnect 16 includes interconnect contacts 26 for making temporary electrical connections with the bumped terminal contacts 12B on the component 10CSP. The interconnect contacts 26 are in electrical communication with the terminal contacts 28 on the base 24. Further details of the interconnect contacts 26 will be hereinafter described. The interconnect 16 also includes bond pads 38 and conductors 40 in electrical communication with the interconnect contacts 26. Bond wires 44 are wire bonded to the bond pads 36 on the base 24, and to the bond pads 38 on the interconnect 16. The bond wires 44 complete the electrical paths between the interconnect contacts 26 and the terminal contacts 28 on the base 24.

The base 24 also includes a clamp ring 42 for attaching the force applying mechanism 20. The force applying mechanism 20 can be removably attached to the clamp ring 42 during assembly of the test system 18. The clamp ring 42 has a generally frame like configuration and includes grooves 45 wherein the force applying mechanism 20 is attached. In the illustrative embodiment, the clamp ring 42 comprises metal, and is attached to the base 24 using a brazing process. One suitable metal for the clamp ring 42 comprises "KOVAR" coated with gold. The base 24 can include bonding features, such as metal pads for attaching the clamp ring 42.

As also shown in FIG. 2, the force applying mechanism 20 comprises a clamp 46, a biasing member 48, and a pressure plate 50. The clamp 46 comprises a flexible bridge-like structure formed of a resilient material such as steel. The clamp 46 includes opposed sides movable towards one another. The clamp 46 also includes tabs 52 that physically engage the grooves 45 of the clamp ring 42. Additionally, the clamp 46 includes an opening 56 which provides access to the component 10CSP for a vacuum assembly tool during assembly of the test system 18. The biasing member 48 also includes an opening 58, and the pressure plate 50 includes an opening 60 for the vacuum assembly tool. A pair of openings 62 can also be provided on the clamp 46 for manipulation of the clamp 46 by a vacuum assembly tool during assembly of the carrier.

In the illustrative embodiment, the biasing member 48 is made of a resilient spring material such as steel, and as shown in FIG. 2, has a generally bow, or leaf-spring shape. The biasing member 48 can also comprise an elastomeric block. U.S. patent application No. 08/899,433 filed Dec. 13, 1997, Pat. No. 6,018,249, entitled "TEST SYSTEM WITH MECHANICAL ALIGNMENT FOR SEMICONDUCTOR CHIP SCALE PACKAGES AND DICE", which is incorporated herein by reference, describes an elastomeric block biasing member. Also for some applications, the pressure plate 50 can be eliminated, particularly if the force applying mechanism 20 includes an elastomeric block biasing member.

Figure 4:
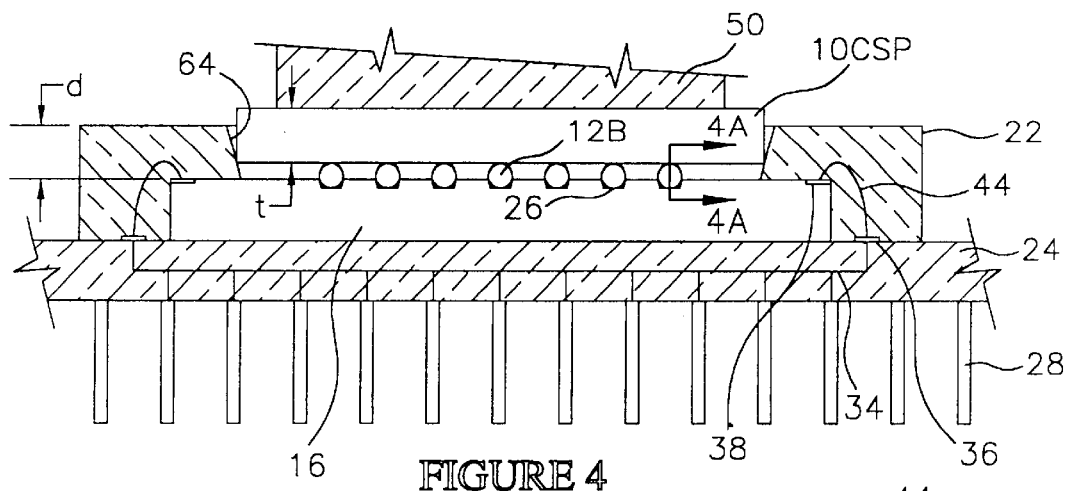
FIG. 4 is an enlarged cross sectional view taken along section line 4—4 of FIG. 3 illustrating a polymer alignment member of the test system.

Referring to FIG. 4, the polymer alignment member 22 is shown in the assembled test system 18 following alignment of the component 10CSP to the interconnect 16. The polymer alignment member 22 includes an alignment opening 64 having a peripheral outline that is slightly larger than a peripheral outline of the component 10CSP. The alignment opening 64 includes sloped sidewalls for contacting the outside edges of the component 10CSP, to guide the component 10CSP onto the interconnect 16. In addition, the depth "d" of the alignment opening 64 is slightly less than a thickness "t" of the component 10CSP, such that the pressure plate mechanically engages the component 10CSP for applying the biasing force.

Figure 4A:
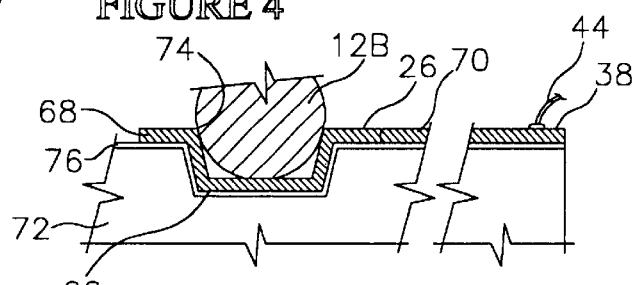
FIG. 4A is an enlarged cross sectional view taken along section line 4A—4A of FIG. 4 illustrating an interconnect contact electrically engaging a terminal contact on the component.

With the component 10CSP aligned with the interconnect 16, the interconnect contacts 26 electrically engage the bumped terminal contacts 12B on the component 10CSP. In FIG. 4A, an interconnect contact 26 is shown electrically engaging a bumped terminal contact 12B. The interconnect contact 26 can be formed integrally with a substrate 72 of the interconnect 16. Preferably, the substrate 72 comprises silicon, such that a coefficient of thermal expansion (CTE) of the interconnect 16 matches that of the semiconductor component 10CSP, which typically also comprises silicon. Alternately, germanium, a reinforced glass resin material, or a ceramic material, can be used as the substrate material.

The interconnect contact 26, broadly stated, comprises: a recess 66 in the interconnect substrate 72; a conductive layer 68 on the recess 66; and an insulating layer 76 between the substrate 72 and the conductive layer 68. One method for forming the recess 66 is by forming a mask (not shown) on the interconnect substrate 72, such as a photopatterned resist mask, and then etching the interconnect substrate 72 through openings in the mask, using an etchant. With the interconnect substrate 72 comprising silicon, a suitable etchant for performing the etch process comprises a solution of KOH.

The recess 66 is sized and shaped to retain and electrically engage the bumped terminal contact 12B. A representative diameter, or width, of the recess 66 can be from 2 mils to 50 mils or more. This diameter can be less than a diameter of the bumped terminal contact 12B so that only portions thereof will be contacted. A depth of the recess 66 can be equal to or less than the diameter of the recess 66. A pitch or spacing of the recess 66 relative to adjacent recesses 66 will exactly match a pitch P (FIG. 1D) of the bumped terminal contact 12B.

The conductive layer 68 can comprise a layer of a highly conductive metal such as aluminum, titanium, nickel, iridium, copper, gold, tungsten, silver, platinum, palladium, tantalum, molybdenum or alloys of these metals. The conductive layer 68 can be formed on the insulating layer 76 to a desired thickness using a suitable metallization process (e.g., CVD, photopatterning, etching). Peripheral edges 74 of the conductive layer 68 are adapted to penetrate native oxide layers on the bumped terminal contact 12B to contact the underlying metal.

As also shown in FIG. 4A, the conductive layer 68 is in electrical communication with a conductor 70 and corresponding bond pad 38 on the interconnect substrate 72. Bond wire 44 electrically connects the bond pad 38 to the corresponding bond pad 36 (FIG. 4) on the base 24. The conductive layers 68 and conductors 70 can be formed using the same metallization process, or using different metallization processes. In addition, the conductive layers 68 and conductors 70 can be formed as multi-layered stacks of metals (e.g., bonding layer/barrier layer). Still further, the conductors 36 can be electrically insulated with an outer insulating layer (not shown). Further details of the interconnect contact 26 are described in U.S. patent application No. 08/829,193, filed Mar. 31, 1997, Pat. No. 5,962,921, entitled "INTERCONNECT HAVING RECESSED CONTACT MEMBERS WITH PENETRATING BLADES FOR TESTING SEMICONDUCTOR DICE AND PACKAGES WITH CONTACT BUMPS", which is incorporated herein by reference.

Figure 5A:
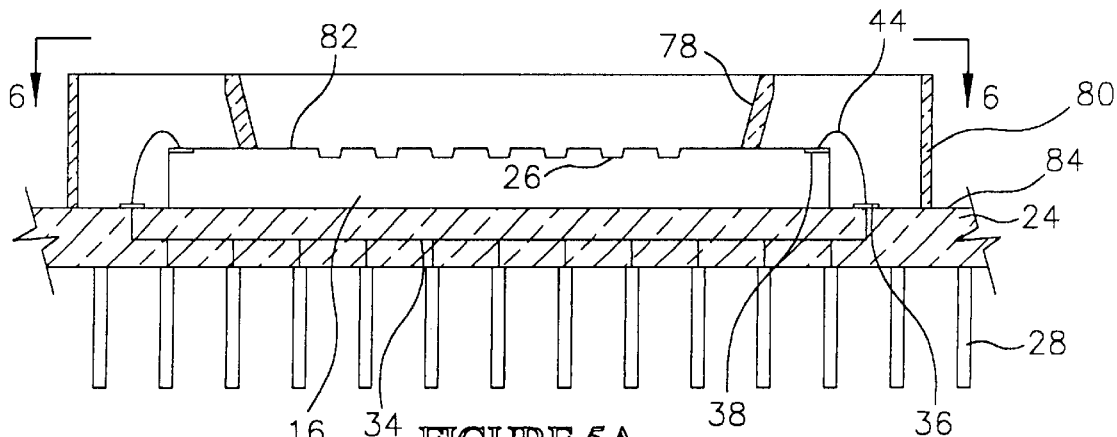
FIGS. 5A–5B are enlarged cross sectional views illustrating steps in a method for fabricating the polymer alignment member of FIG. 4.
Figure 5B:
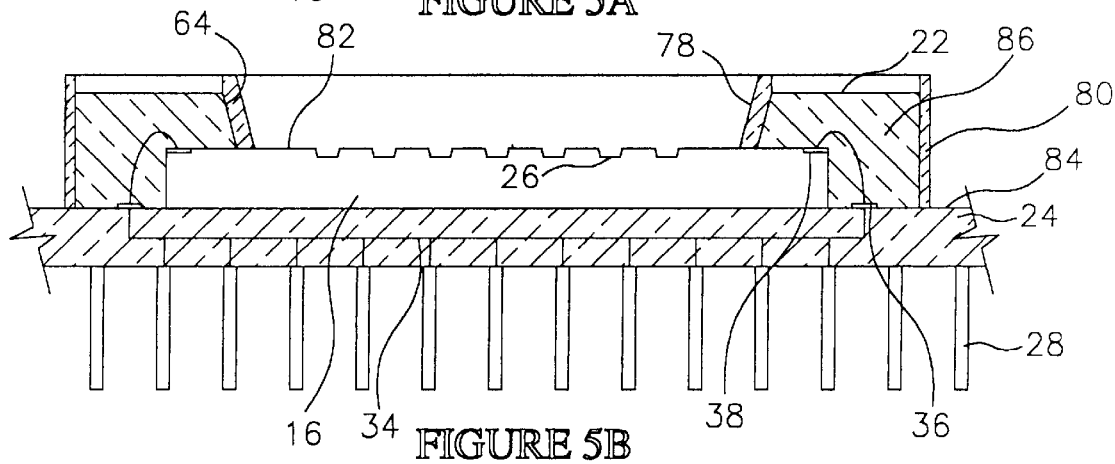

Referring to FIGS. 5A and 5B, steps in a method for fabricating the polymer alignment member 22 are illustrated. Initially as shown in FIG. 5A, a mold 78, and a dam 80 are provided. The mold 78 determines the size, peripheral shape, and slope of the alignment opening 64 for the polymer alignment member 22. The dam 80 determines the outer peripheral shape of the polymer alignment member 22.

The mold 78 is placed directly on a surface 82 of the interconnect 16. The dam 80 is placed directly on a surface 84 of the base 24. The mold 78 and the dam 80 can be formed of a rigid material, such as hard plastic or stainless steel, using suitable fabrication processes such as molding or machining. In addition, the mold 78 and the dam 80 can be coated with an anti-stick material, such as a mold release agent or a coating such as "TEFLON", to facilitate removal following molding of the polymer alignment member 22 (FIG. 5B).

Figure 6:
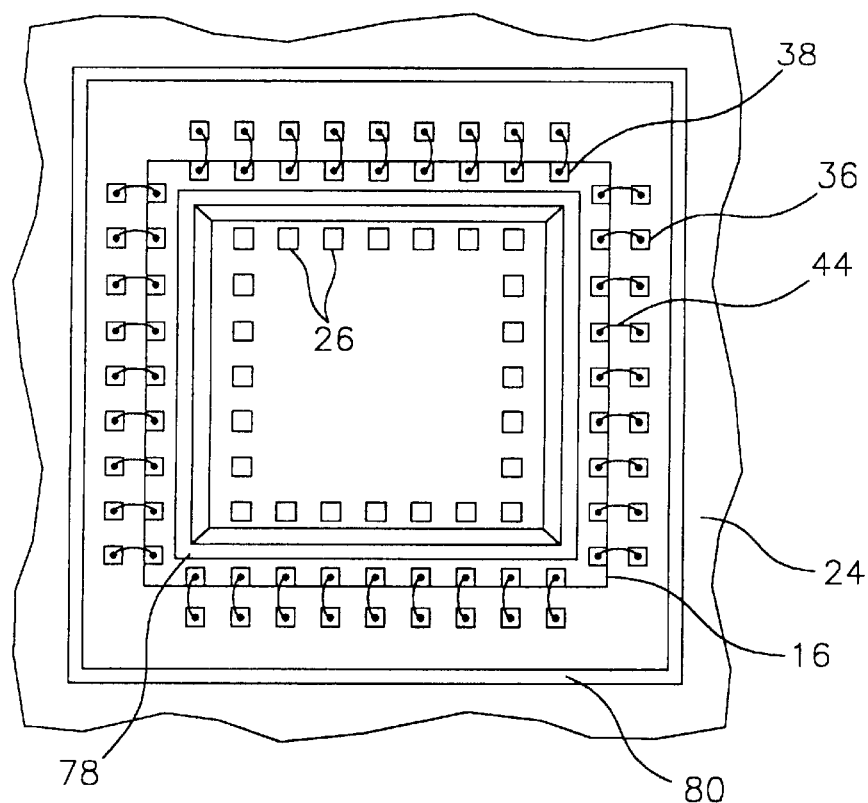
FIG. 6 is a plan view taken along section line 6—6 of FIG. 5A illustrating a mold used during fabrication of the polymer alignment member.

As shown in FIG. 6, the mold 78 has a generally square, frame-like peripheral configuration. In addition, the mold 78 is configured to form the alignment opening 64 (FIG. 5B) of the polymer alignment member 22, with opposed sides, having inwardly sloping guide surfaces for engaging the edges of the component 10CSP. The distances between the guide surfaces of the alignment opening 64 are largest at the exposed surface of the polymer alignment member 22, and smallest at the surface 82 of the interconnect 16.

The dam 80 also has a generally square, frame-like configuration, but is configured to form the outer periphery of the polymer alignment member 22 with opposed sides that are generally orthogonal to the surface 84 of the base 24. For some applications, the base 24 can include a recess (not shown) with vertical sidewalls wherein the interconnect 16 is located. In this case the dam 80 can be omitted and the polymer alignment member 22 formed directly in the recess.

The mold 78 and the dam 80 can be maintained in contact with the interconnect 16 by their own weight, or by using additional weight, or a clamp. For aligning the mold 78, the interconnect 16 can include alignment features, such as deposited or etched scribe lines, formed during fabrication of the interconnect 16. Similarly, the base 24 can include alignment features for aligning the dam 80.

Following placement of the mold 78 on the interconnect 16, and the dam 80 on the base 24, the space between the mold 78 and the dam 80 can be filled with a polymer material 86 in a viscous, or liquid state. The polymer material 86 can then be cured to a hardened state, and planarized if desired. The polymer material 86 can comprise a variety of materials, any of which can be cured, or dried, from a viscous, or liquid, state to a hardened state. Suitable polymer materials include two-part epoxies, thermoset epoxies, and photocureable polymers. The particular formulations of the polymer material 86 are a design consideration dependent on the desired hardness, curing time, and curing method. Following curing of the polymer material 86, the mold 78 and the dam 80 can be removed to complete the polymer alignment member 22. In addition to providing an alignment function, the alignment member 22 also encapsulates and protects the bond wires 44.

Figure 7A:
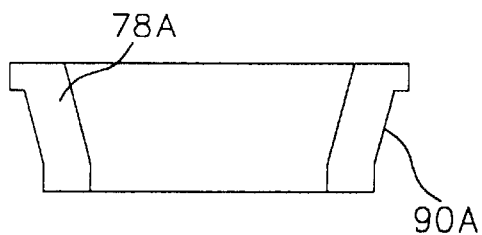
FIG. 7A is a schematic cross sectional view illustrating an alternate embodiment mold.
Figure 7B:
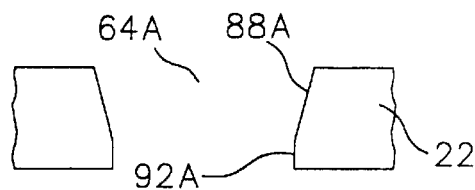
FIG. 7B is a schematic cross sectional view illustrating an alignment opening in the polymer alignment member formed using the mold of FIG. 7A.

Referring to FIG. 7A, an alternate embodiment mold 78A is illustrated. FIG. 7B illustrates the shape of an alignment opening 64A in the polymer alignment member 22, which is obtained using the mold 78A. A guide surface 88A (FIG. 7B) of the alignment opening 64A has a topography that corresponds to a molding surface 90A (FIG. 7A) of the mold 78A. As before, the guide surface 88A includes opposed sloped sidewalls. In addition, the guide surface 88A includes a generally square shape opening 92A with vertical side walls. The opening 92A is slightly larger than the peripheral shape of the component 10CSP (FIG. 1D) and is designed such that the component 10CSP drops onto the interconnect 16.

Figure 8A:
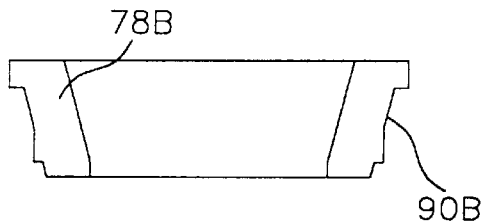
FIG. 8A is a schematic cross sectional view illustrating an alternate embodiment mold.
Figure 8B:
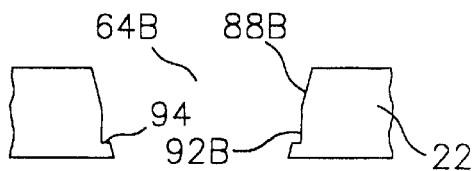
FIG. 8B is a schematic cross sectional view illustrating an alignment opening in the polymer alignment member formed using the mold of FIG. 8A.

Referring to FIG. 8A, an alternate embodiment mold 78B is illustrated. FIG. 8B illustrates the shape of an alignment opening 64B in the polymer alignment member 22, which is obtained using the mold 78B. A guide surface 88B (FIG. 8B) of the alignment opening 64B has a topography that corresponds to a molding surface 90B (FIG. 8A) of the mold 78B. As before, the guide surface 88B includes opposed sloped sidewalls. In addition, the guide surface 88B includes a generally square shaped opening 92B with vertical side walls and a planar lower surface. The opening 92B is slightly larger than the peripheral shape of the component 10CSP (FIG. 1D). The planar surface 94 is designed to provide a stop plane for the component 10CSP. In this embodiment, the planar surface 94 must be spaced from the interconnect 16 (FIG. 4) by a distance that is less than a height of the bumped contacts 12B (FIG. 4), such that the bumped contacts 12B can engage the interconnect contacts 26 (FIG. 4).

Figure 9A:
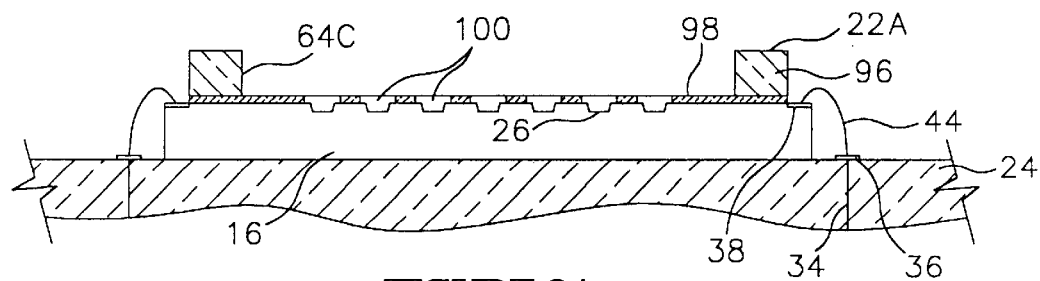
FIG. 9A is a schematic cross sectional view illustrating an alternate embodiment polymer alignment member having a coarse alignment layer and a fine alignment layer.
Figure 9B:
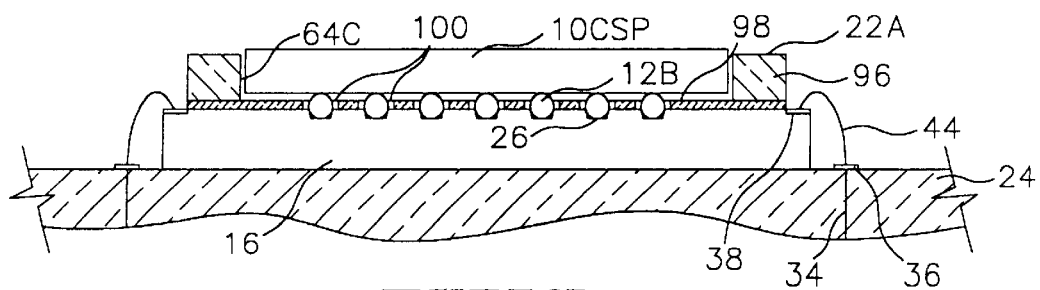
FIG. 9B is a schematic cross sectional view of the alternate embodiment polymer alignment member during alignment of the semiconductor component.

Referring to FIGS. 9A and 9B, an alternate embodiment polymer alignment member 22A is illustrated. The polymer alignment member 22A includes a coarse alignment layer 96 and a fine alignment layer 98. The coarse alignment layer 96 includes a coarse alignment opening 64C configured to engage the peripheral edges of the component 10CSP, substantially as previously described for alignment opening 64 (FIG. 4). The fine alignment layer 98 includes a pattern of fine alignment openings 100 configured to guide the bumped terminal contacts 12B into the interconnect contacts 26. A thickness of the fine alignment layer 98 is less than an average height of the bumped terminal contacts 12B. This thickness is preferably from about 3 mils to 7 mils. In addition, a diameter of the fine alignment openings 100 is slightly greater than the diameter of the bumped terminal contacts 12B. A representative diameter for the fine alignment openings 100 for 12 mil diameter bumped terminal contacts 12B can be from 13 mils to 15 mils.

The fine alignment layer 98 can comprise a photoimageable polymer, which is deposited to a required thickness, photo or laser patterned, developed with the pattern of fine alignment openings 100, and then cured. Similarly the coarse alignment layer 96 can comprise the same photoimageable polymer, which is deposited to a required thickness, photopatterned, developed with the coarse alignment opening 64C, and then cured.

One suitable photoimageable polymer comprises a thick film, negative tone resist sold by Shell Chemical under the trademark "EPON RESIN SU-8". Such a resist can be deposited in layers to thicknesses of from about 5–50 mils. A conventional resist coating apparatus, such as a spin coater, can be used to deposit the resist onto the interconnect 16. The deposited resist can then be "prebaked" at about 95° C. for about 15 minutes and exposed in a desired pattern using a conventional UV aligner with a dose of about 165 mJ/cm$^2$. Developing can be accomplished with a solution of PGMEA (propylenglycol-monomethylether-acetate). This can be followed by a hard bake at about 200° C. for about 30 minutes.

Referring to FIGS. 10A–10D, an alternate embodiment interconnect 16A having an integrally formed alignment member is illustrated. In this embodiment the alignment member comprises an alignment opening 64D etched into a substrate 72A (FIG. 10C) of the interconnect 16A. Preferably the substrate 72A comprises an etchable material such as silicon or ceramic. For example, with the substrate 72A comprising silicon, an anisotropic etch process can be performed using an etchant, such as KOH, to form the alignment opening 64D. with sloped sidewalls. In addition, the alignment opening 64D only extends partially through the substrate 72A, such that a pocket with a planar surface 102 is formed on the substrate 72A. The interconnect contacts 26A are located on the planar surface 102, and completely enclosed, by the alignment opening 64D.

The interconnect contacts 26A are substantially similar to the interconnect contacts 26 (FIG. 4A) previously described. The interconnect contacts 26A comprise recesses 66A (FIG. 10C) in the substrate 72A that are sized and shaped to retain, and center the bumped terminal contacts 12B. The interconnect contacts 26A thus function to provide fine alignment for the component 10CSP. In addition, the interconnect contacts 26A include projections 104 within the recesses 66A for penetrating the bumped terminal contacts 12B on the component 10CSP. The projections 104 are at least partially covered with conductive layers 68A (FIG. 10C), substantially equivalent to the conductive layers 68 (FIG. 4A) previously described. In addition, an insulating layer 76A is provided on the substrate 72A for electrically insulating the conductive layers 68A.

Figure 10A:
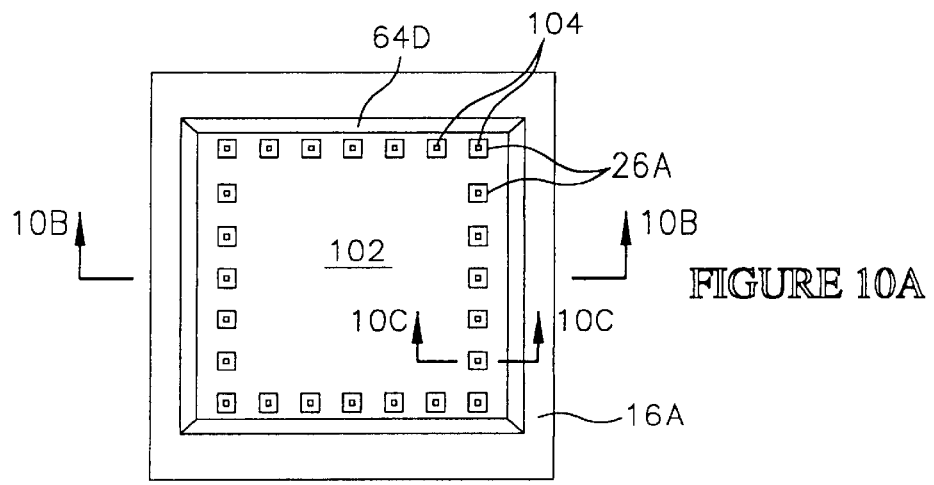
FIG. 10A is an enlarged plan view of an interconnect with an alternate embodiment alignment member comprising an alignment opening etched into a substrate of the interconnect.
Figure 10B:
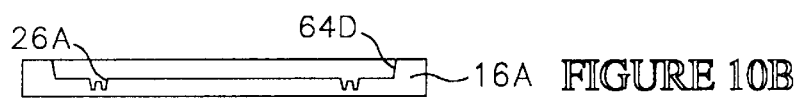
FIG. 10B is a cross sectional view of the interconnect taken along section line 10B—10B of FIG. 10A.
Figure 10C:
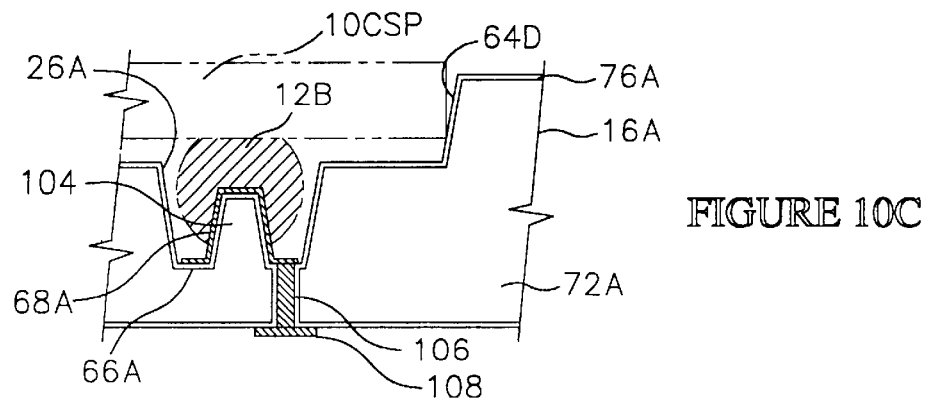
FIG. 10C is an enlarged cross sectional view taken along section line 10C—10C of FIG. 10A illustrating the etched alignment opening and an interconnect contact electrically engaging a bumped terminal contact on the component.
Figure 10D:
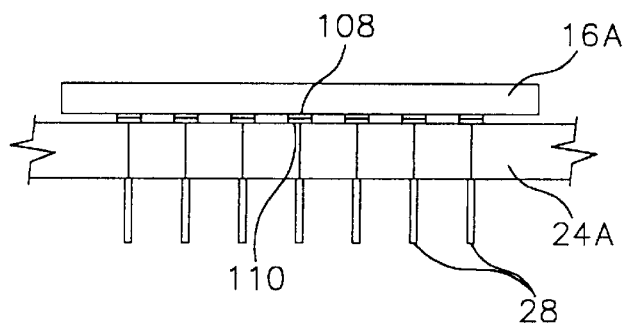
FIG. 10D is a schematic cross sectional view illustrating the mounting of the interconnect of FIG. 10A to a base of a test system.

The conductive layers 68A are in electrical communication with conductive vias 106 (FIG. 10C) in the substrate 72A. The conductive vias 106 provide an electrical path to the interconnect contacts 26A. The conductive vias 106 include bonding pads 108 (FIG. 10C) formed on a surface of the substrate 72A. As shown in FIG. 10D, the interconnect 16A can be mounted to a base 24A substantially equivalent to the base 24 (FIG. 2) previously described. The base 24A includes bonding pads 110 which can be physically bonded to the bonding pads 108 on the interconnect 16A using a process such as solder reflow.

Figure 11A:
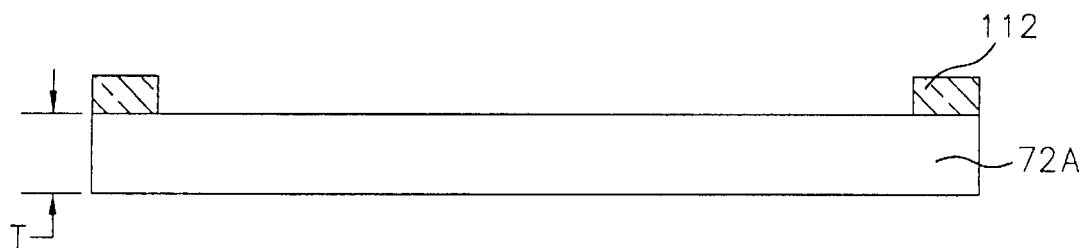
FIGS. 11A–11D are schematic cross sectional views illustrating steps in a method for fabricating the interconnect of FIG. 10A.

Referring to FIGS. 11A–11D, steps in a method for fabricating the interconnect 16A are illustrated. Initially, as shown in FIG. 11A, the substrate 72A is provided. In the illustrative embodiment the substrate 72A comprises monocrystalline silicon. Preferably, the substrate is provided as a wafer of material, such as a silicon wafer blank used in semiconductor manufacture. Following the fabrication process the wafer can be diced into individual interconnects 16A.

As also shown in FIG. 11A, a mask 112 is formed on the substrate 72A. The mask 112 can comprise a hard mask, such as Si$_3$N$_4$, or a resist mask, both of which can be fabricated using techniques that are known in the art. The mask 112 can be used to etch the alignment opening 64D (FIG. 11B) using a wet or dry etch process.

Figure 11B:
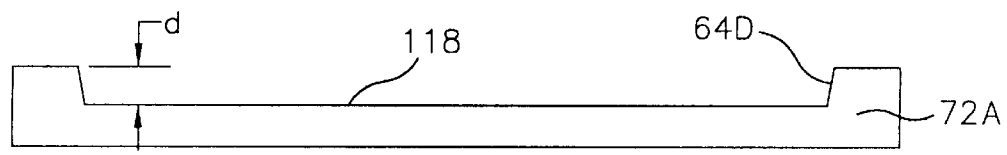

As shown in FIG. 11B, the alignment opening 64D comprises a pocket etched part way through the substrate 72A and having a peripheral outline that is slightly larger than the peripheral outline of the component. A planar surface 118 is also formed on the substrate 72A by the alignment opening 64D. With the substrate 72A being formed of silicon, an anisotropic etch process can be performed, such that the alignment opening 64D has sloped sidewalls. The sloped sidewalls of the alignment opening 64D have a peripheral outline that is slightly larger (e.g., 0.25–3 mils) than the peripheral outline of the component being aligned. One suitable etchant for performing the etch process is a solution of KOH. The etch process can be endpointed, by control of the etching parameters and etching time, such that the planar surface 118 is formed part way through the thickness of the substrate. The depth d of the alignment opening 64D to the planar surface 118 is approximately equal to the thickness of the component being tested. A representative value for the depth d can be from 0.014 inches (0.356 mm) to 0.036 inches (1.068 mm). The thickness T (FIG. 11A) of the substrate 72A can be selected based on the required depth d of the alignment opening 64D.

Figure 11C:
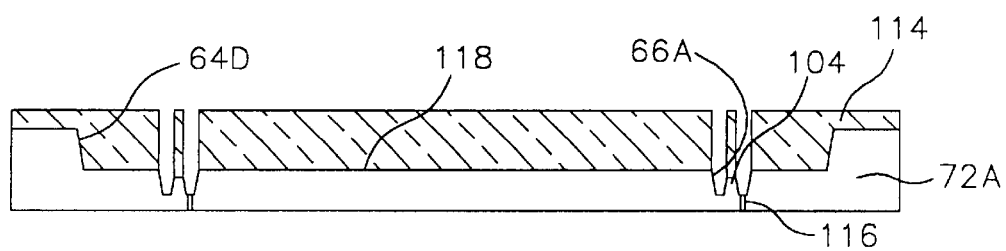

Next, as shown in FIG. 11C, a second mask 114 is formed on the substrate 72A over the alignment opening 64D and the planar surface 118. As before the second mask 114 can comprise a hard mask or a resist mask. The second mask 114 can be used to etch the recesses 66A and the projections 104 in the surface 118. The recesses 66A and projections 104 are elements of the interconnect contacts 26A (FIG. 10C). As before, an anisotropic etch process can be performed using a solution of KOH. If the same mask 114 is used, the height of the projections 104 will be approximately equal to the depth of the recesses 66A. In the illustrative embodiment, the height of the projections 104 is less than the depth of the recesses 66A. This requires an additional mask and etch step, which for simplicity are not shown. The increased height of the recesses 66A relative to the projections 104 helps to center the bumped contacts 12B (FIG. 10C) on the projections 104. A fine alignment function can thus be performed similarly to the openings 100 (FIG. 9A) for fine alignment layer 98 (FIG. 9A0. A representative depth of the recesses 66A can be about 25 μm to 100 μm, and a representative diameter or width can be about 25 μm to 100 μm. The projection 104 can have a height of about 25 μm to 10 μm and a width of about 10 μm to 50 μm.

Following etching of the recesses 66A and the projections 104, the mask 114 can be removed using a suitable stripper. In addition, openings 116 for conductive vias 106 (FIG. 10C) can be formed in the substrate 72A from the recesses 66A to the backside of the substrate 72A. One method for forming the openings 116 is with a laser machining process. A suitable laser machining apparatus is manufactured by General Scanning of Sommerville, Mass. and is designated a Model No. 670-W. Another suitable laser machining apparatus is manufactured by Synova S.A., Lausanne, Switzerland. A representative diameter of the openings 116 can be from 10 μm to 2 mils or greater. A representative laser fluence for forming the openings 116 through a substrate 72A comprising silicon and having a thickness of about 28 mils is from 2 to 10 watts/per opening at a pulse duration of 20–25 ns and at a repetition rate of up to several thousand per second. The wavelength of the laser beam can be a standard infrared or green wavelength (e.g., 1064 nm–532 nm).

Following formation of the openings 116, the insulating layers 76A (FIG. 10C) can be formed within the openings 116 and on exposed surfaces of the substrate 72A, projections 104 and recesses 66A. For simplicity the insulating layers 76A are not shown in FIG. 11C. The insulating layers 76A can comprise an electrically insulating material, such as $SiO_2$, or $Si_3N_4$, deposited to a desired thickness using CVD, or other deposition process. A $SiO_2$ layer can also be grown on exposed surfaces of the substrate 72A using an oxidizing atmosphere such as steam and $O_2$ at an elevated temperature (e.g., 950° C.). The insulating layers 76A can also comprise a polymer, such as polyimide, deposited and planarized using a suitable process (e.g., spin-on-process). Depending on the material, a representative thickness of the insulating layers 76A can be from about 100 Å to several mils.

Figure 11D:
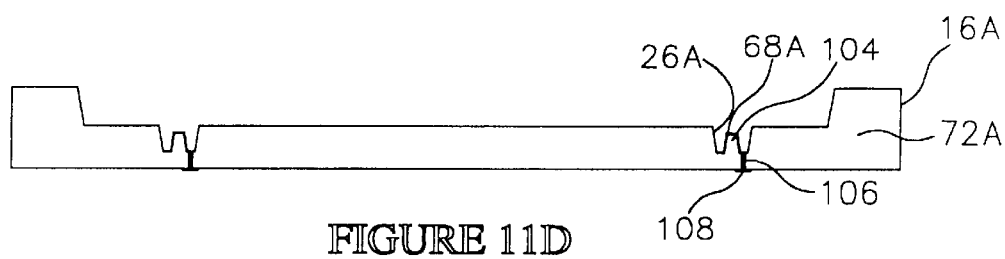

Next, as shown in FIG. 11D, the conductive layers 68A can be formed on the projections 104, and if desired within the recesses 66A. The conductive layers 68A can comprise a thin film metal deposited to a thickness of several hundred Å or more using a process such as CVD. The conductive layers 68A conductive metal such as aluminum, chromium, titanium, nickel, iridium, copper, gold, tungsten, silver, platinum, palladium, tantalum, molybdenum or alloys of these metals such as $TiSi_2$.

Following, or prior to, formation of the conductive layers 68A, a metal can be deposited within the openings 116 to form the conductive vias 106. The metal can be deposited using a deposition process, such as CVD, electrolytic deposition or electroless deposition. Alternately, rather than being a metal, the conductive material for the conductive vias 106 can comprise a conductive polymer, such as a metal filled silicone, a carbon filled ink, or an isotropic or anisotropic adhesive.

At the same time the conductive material is deposited in the openings 116 to form the conductive vias 106, the bonding pads 108 can be formed on the backside of the substrate 72A. A suitable mask (not shown) can be used during deposition of the conductive material to form the bonding pads 108 with a desired thickness and peripheral shape. Alternately, the bonding pads 108 can comprise a different material than the conductive vias 106 formed using a separate deposition or metallization process. For example, the bonding pads 108 can comprise a solderable metal, such as copper, nickel or palladium, while the conductive vias 106 can comprise a material such as nickel.

Referring to FIGS. 12A–12E an alternate embodiment wafer interconnect 16W is shown. The wafer interconnect 16W is substantially similar to the interconnect 16A (FIG. 10A) previously described, but is configured for testing the wafer sized component 10W. The wafer interconnect 16W includes a plurality of test sites 140 (FIG. 12A) that correspond to the locations of the components 10D (FIG. 1B) on the component 10W. Each test site 140 includes a pattern of interconnect contacts 26W configured to electrically engage the planar contacts 12P on the component 10W.

The wafer interconnect 16W also includes an alignment opening 64W configured to align the component 10W, such that the interconnect contacts 26W electrically engage the planar contacts 12P. In addition, the wafer interconnect 16W includes a planar surface 102W wherein the interconnect contacts 26W are formed. Further, the wafer interconnect 16W includes conductive vias 106W (FIG. 12C), and bonding pads 108W (FIG. 12C) in electrical communication with the interconnect contacts 26W.

Figure 12A:
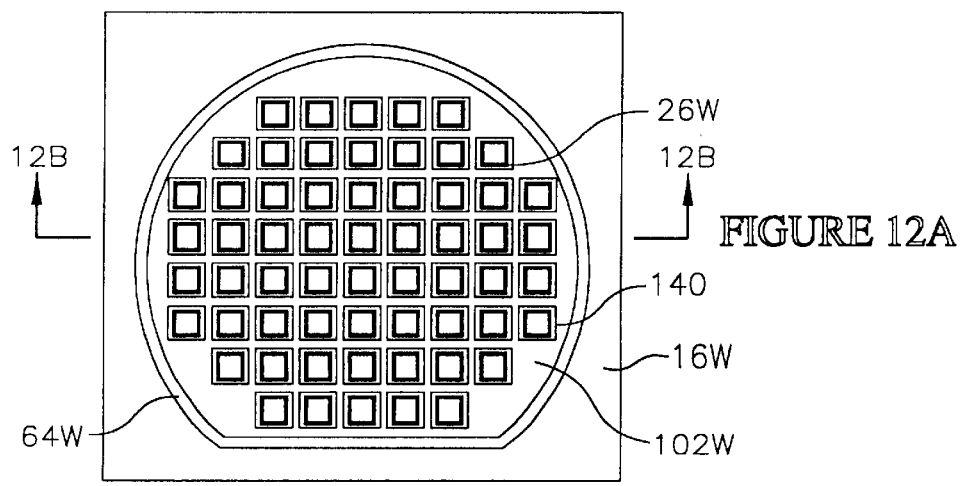
FIG. 12A is a plan view of an alternate embodiment wafer interconnect with an etched alignment opening.
Figure 12B:
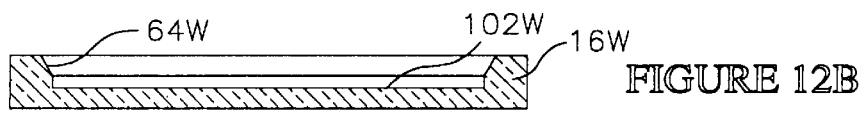
FIG. 12B is a cross sectional view taken along section line 12B—12B of FIG. 12A.
Figure 12C:
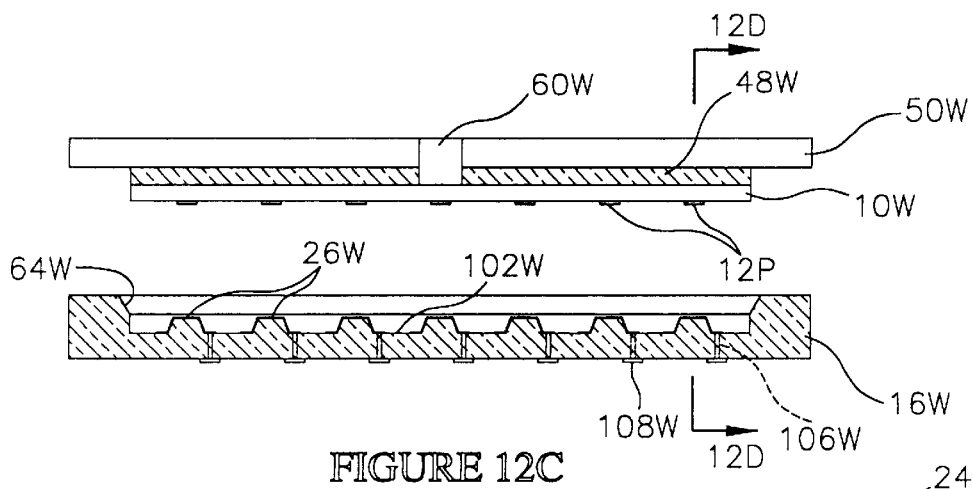
FIG. 12C is a schematic cross sectional view of the wafer interconnect during alignment of a wafer component.
Figure 12D:
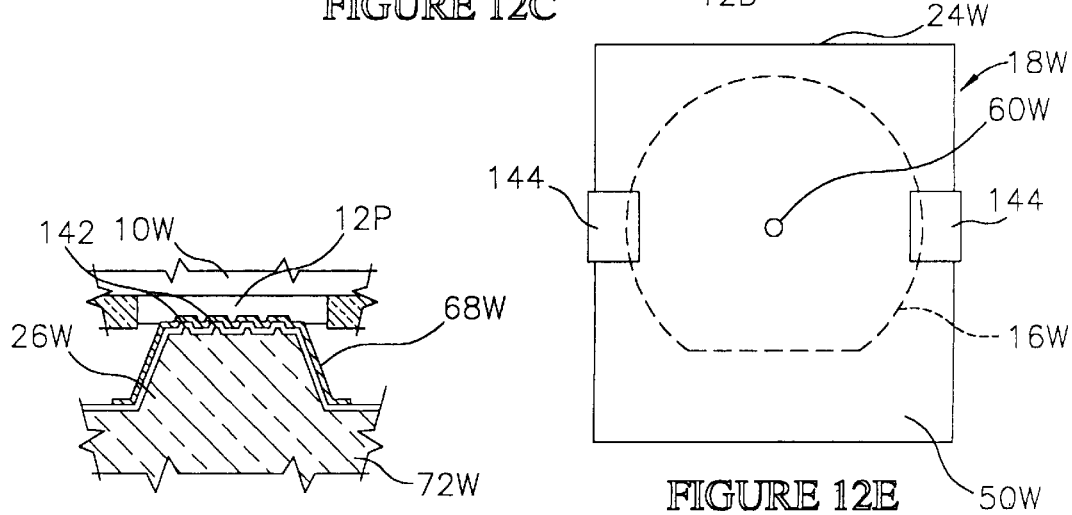
FIG. 12D is an enlarged cross sectional view illustrating an interconnect contact on the wafer interconnect electrically engaging a planar contact on the wafer component.

As shown in FIG. 12D, the interconnect contacts 26W comprise raised projections formed integrally with a substrate 72W of the wafer interconnect 16W. The interconnect contacts 26W include projections 142 for penetrating the planar contacts 12P on the component 10W. In addition, the interconnect contacts 26W include conductive layers 68W in electrical communication with the conductive vias 106W (FIG. 12C). The interconnect contacts 26W can be fabricated as described in U.S. Pat. No. 5,686,317 to Akram et al., which is incorporated herein by reference. The wafer interconnect 16W can be fabricated substantially as previously described and shown in FIGS. 11A–11D for interconnect 16A.

Figure 12E:
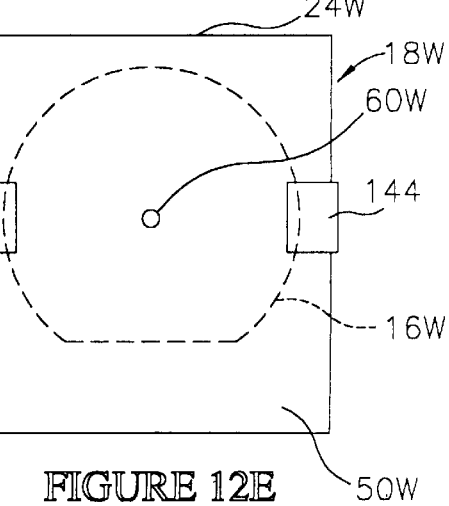
FIG. 12E is a plan view of a test system constructed with the wafer interconnect.

As shown in FIG. 12E, a test system 18W can be constructed using the wafer interconnect 16W. The test system 18W includes a base 24W, which functions as previously described for base 24 (FIG. 2). In addition, the test system 18W includes a pressure plate 50W, and a biasing member 48W (FIG. 12C) for biasing the component 10W against the interconnect 16W. Clips 144 (FIG. 12E) secure the pressure plate 50W to the base 24W. The pressure plate 50W also includes an opening 60W to allow handling of the component 10W with a vacuum tool as previously described for system 18 (FIG. 3).

Figure 13A:
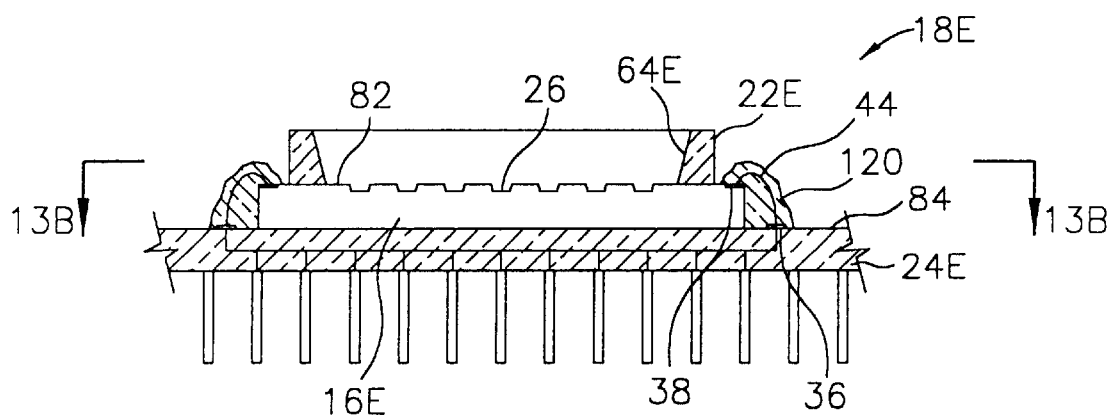
FIG. 13A is a schematic cross sectional view of an alternate embodiment alignment member and test system.
Figure 13B:
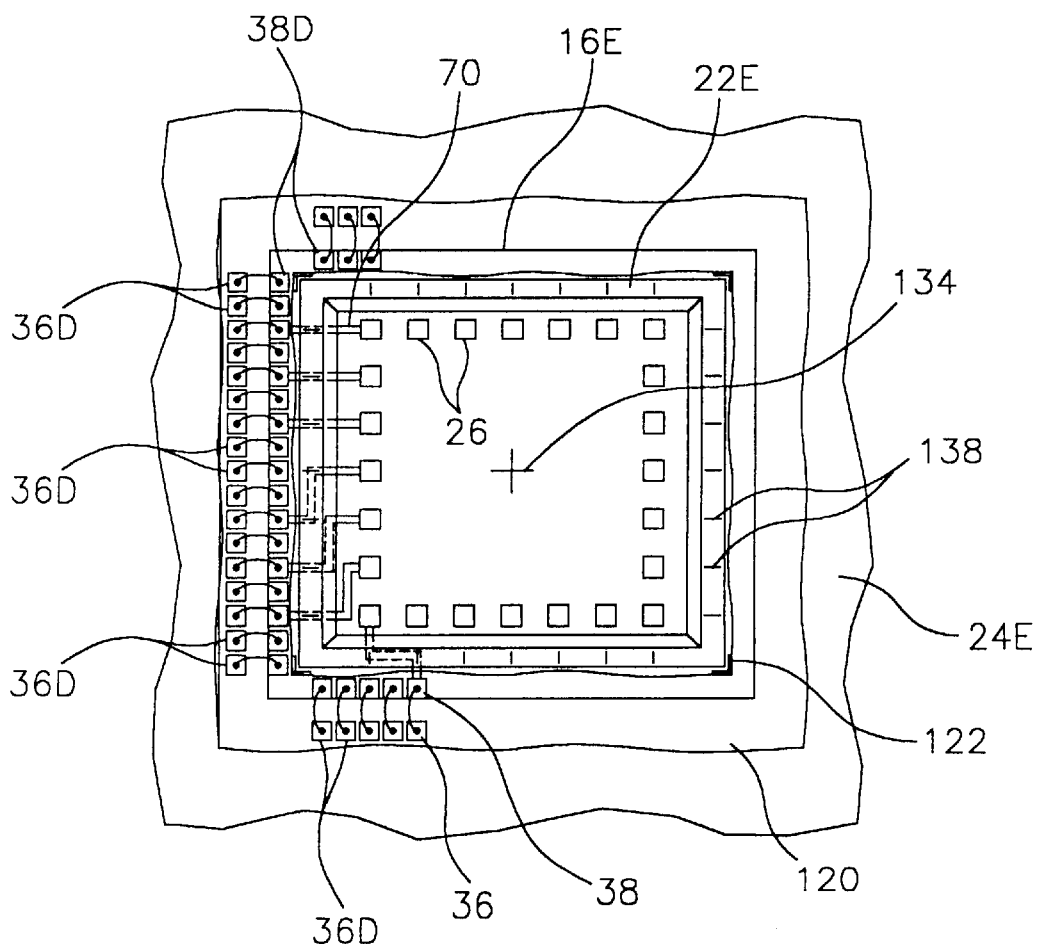
FIG. 13B is a cross sectional view taken along section line 13B—13B of FIG. 13A.

Referring to FIGS. 13A and 13B, an alternate embodiment alignment member 22E and test system 18E are illustrated. The test system 18E includes an interconnect 16E and a base 24E which function substantially as previously described. In addition, the interconnect 16E includes contacts 26 as previously described.

The alignment member 22E comprises a separately formed element attached to the interconnect 16E using a process to be hereinafter described. The alignment member 22E includes an alignment opening 64E which functions as previously described. The alignment member 22E comprises a rigid material such as silicon, plastic, ceramic or metal, and can be fabricated using techniques that are known in the art. For example, a fabrication process for a silicon alignment member is disclosed in U.S. Pat. No. 5,559,444 to Farnworth et al., which is incorporated herein by reference.

The interconnect 16E also includes an encapsulant 120 which encapsulates the bond wires 44. The encapsulant 120 also encapsulates bonding pads 38 on the interconnect 16E and bonding pads 36 on the base 24E. The encapsulant 120 comprises a polymer material, such as an epoxy resin or a silicone based elastomer. The encapsulant 120 can be dispensed onto the wires 44 and bonding pads 36, 38 as a "glob top" and then cured.

For some applications it may be desirable to dispense the encapsulant 120 prior to attaching the alignment member 22E to the interconnect 16E. Accordingly, the interconnect 16E includes dams 122 (FIG. 13B) which prevent the encapsulant 120 from flowing into the area that will be subsequently occupied by the alignment member 22E. In addition, the dams 122 prevent the flow of the encapsulant onto the contacts 26. The dams 122 comprise ridges or pedestals, that can be deposited on the interconnect 16E using a polymer material such as the thick film resist previously described. Alternately the dams can comprise ridges, pedestals or recesses formed integrally with the interconnect 16E using an etching process as previously described.

The interconnect 16E and the base 24E also include dummy bonding pads 36D, 38D (FIG. 13B) and associated bond wires 44. The dummy bonding pads 36D, 38D and associated bond wires 44 also confine the flow of the encapsulant 120 to desired areas. In the illustrative embodiment, the dummy bonding pads 38D are located at the corners and in the center of the interconnect 16E. However, other arrangements are possible.

Referring to FIGS. 14A–14C, an alignment fixture 124A for mechanically aligning the alignment member 22E (FIG. 14C) to the interconnect 16E (FIG. 14C) during assembly of the test system 18E (FIG. 13A) is illustrated. The alignment fixture 124A has a peripheral outline and a thickness that are identical to the component being tested. In the illustrative embodiment, the peripheral outline and the thickness of the alignment fixture 124A are identical to the component 10D (FIG. 1B), or to the component 10CSP (FIG. 1D). In addition, the alignment fixture 124A includes a pattern of through openings 126 that exactly match a pattern of the contacts 26 (FIG. 14C) on the interconnect 16E (FIG. 14C).

For aligning the alignment member 22E, the alignment fixture 124A can be placed on the interconnect 16E to simulate the component under test. In addition, the openings 126 on the alignment fixture 124A can be visually aligned with the contacts 26 (FIG. 14C) on the interconnect 16E. The alignment member 22E (FIG. 14C) can then be visually aligned with the alignment fixture 124A. For some applications a viewing device such as a magnifying glass, microscope, or optics device can be used to accomplish the visual alignment. In addition, the alignment member 22E (FIG. 14C) can include printed or etched alignment marks 138 (FIG. 14C) to facilitate alignment to the alignment fixture 124A.

With the alignment member 22E (FIG. 14C) aligned to the alignment fixture 124A, the alignment member 22E can be secured to the interconnect 16E (FIG. 14C) using an adhesive or other suitable fastening mechanism. The alignment fixture 124A can then be removed, and the components tested as required.

Referring to FIGS. 15A–15C, an alternate embodiment alignment fixture 124B is illustrated. The alignment fixture 124B has a peripheral outline and thickness identical to the component being tested. In addition, the alignment fixture 124B includes a central opening 128 that allows the contacts 26 (FIG. 15C) on the interconnect 16E (FIG. 15C) to be viewed, when the fixture 124B is placed on the interconnect 16E. The alignment fixture 124B also includes alignment marks 130 that can be visually aligned with the contacts 26 (FIG. 15C) on the interconnect 16E. If required, a viewing device such as a magnifying glass, microscope or optics device can be employed to facilitate viewing of the alignment marks 130 relative to the contacts 26, and the alignment marks 138 (FIG. 15C) relative to the alignment marks 130. This allows mechanical alignment of the alignment fixture 124B to the interconnect 16E (FIG. 15C), and the alignment member 22E (FIG. 15C) to the alignment fixture 124B substantially as previously described.

Referring to FIGS. 16A–16C, an alternate embodiment alignment fixture 124C is illustrated. The alignment fixture 124C has a peripheral outline and thickness identical to the component being tested. In addition, the alignment fixture 124C comprises an optically transparent material, such as glass, having alignment grooves 132 formed therein. As before, the alignment fixture 124C can be placed on the interconnect 16E (FIG. 16C) to simulate the component being tested, and the alignment grooves 132 aligned with the contacts 26 (FIG. 16C). If required, a viewing device such as a magnifying glass, microscope or optics device can be employed to facilitate viewing of the alignment grooves 132 relative to the contacts 26. In addition, the interconnect 16E (FIG. 16C) can include alignment fiducial 134 (FIG. 16C), and the alignment fixture 124C can include alignment fiducial 136 to aid in the alignment process. The alignment fiducials 134, 136 can be printed or etched members.

With the alignment fixture 124C aligned with the interconnect 16E, the alignment member 22E (FIG. 16C) can be aligned to the alignment fixture 124C, substantially as previously described. As before, the alignment member 22E (FIG. 16C) can include alignment marks 138 (FIG. 16C) to facilitate alignment to the alignment fixture 124C.

Figure 17A:
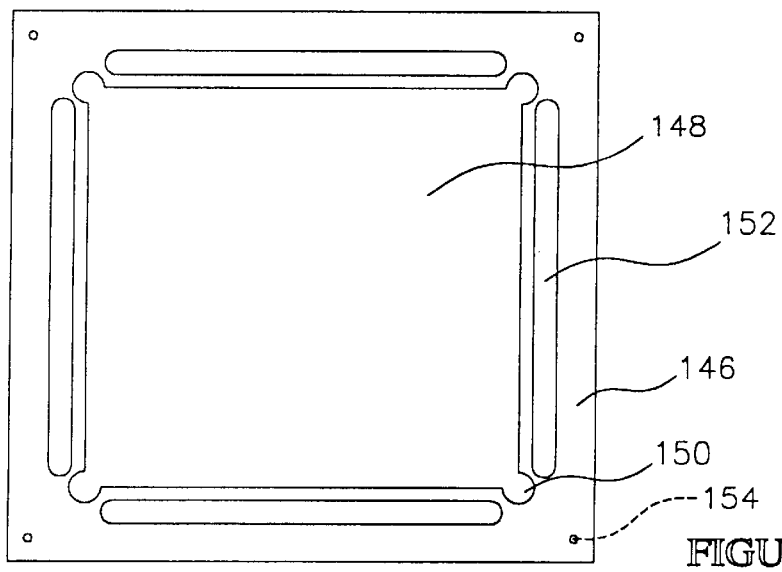
FIG. 17A is a plan view of an assembly fixture for assembling test systems constructed in accordance with the invention.
Figure 17B:
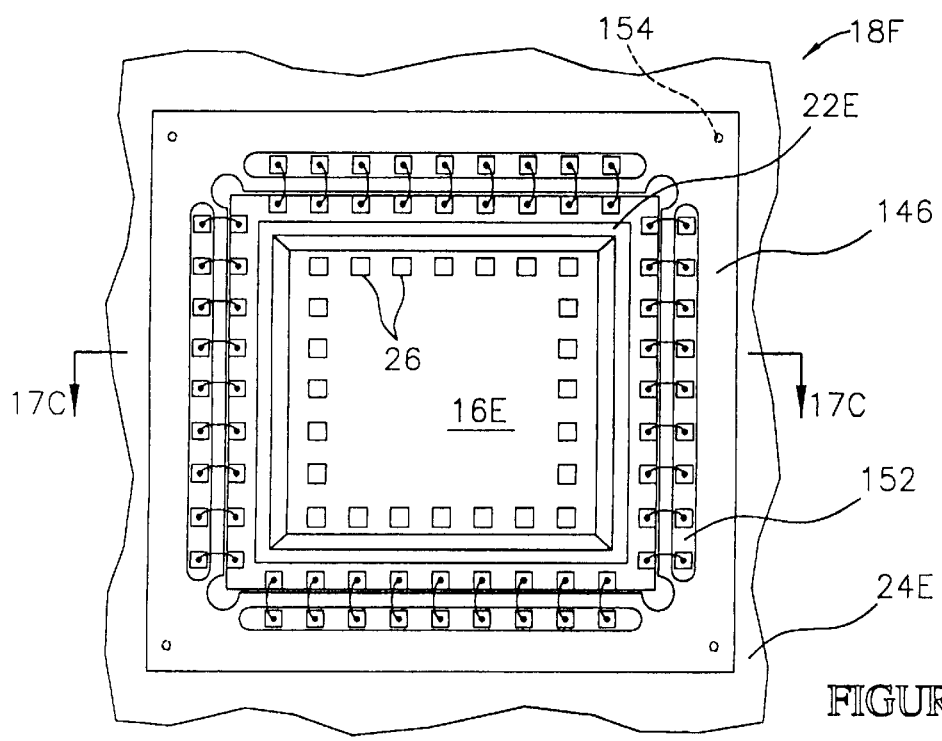
FIG. 17B is a plan view of a test system assembled using the assembly fixture of 17A.
Figure 17C:
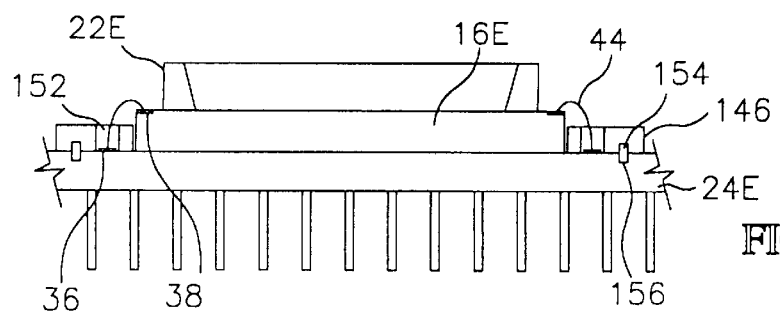
FIG. 17C is a cross sectional view taken along section line 17C—17C of FIG. 17B.

Referring to FIGS. 17A–17C, an assembly fixture 146 used for aligning the interconnect 16E (FIG. 17B) during assembly of a test system 18F (FIG. 17B) is illustrated. The assembly fixture 146 comprises a plate that is placed on the base 24E of the test system. The assembly fixture 146 can be formed of a metal, a plastic or a ceramic material. In addition, the assembly fixture 146 includes alignment pins 154 that mate with corresponding pockets 156 in the base 24E of the test system 18F.

The assembly fixture 146 also includes an opening 148 that has a peripheral outline that is slightly larger (e.g., several mils) that the outline of the interconnect 16E. The opening 148 includes rounded precising corners 150. In addition, the assembly fixture 146 includes slotted openings 152 that allow access to the bonding pads 36 on the base 24E for wire bonding the bond wires 44.

As shown in FIGS. 17B and 17C, for assembling the test system 18F, the assembly fixture 146 can be placed on the base 24E. The interconnect 16E can then be placed through the opening 148 and onto the base 24E. The size and location of the opening 148 precisely positions the interconnect 16E on the base 24E. This allows different interconnects to be interchangeable for testing different types of components. With the interconnect 16E in place on the base 24E, the bond wires 44 can be wire bonded to the bonding pads 36 on the base 24E, and to the bonding pads 38 on the interconnect 16E.

Referring to FIGS. 18A–18D, alternate embodiment alignment members 22F–22I are illustrated. In each of these embodiments, the alignment members are configured to align the component 10D, 10CSP or 10W to the interconnect 16, and also to provide protection for the bond wires 44.

Figure 18A:
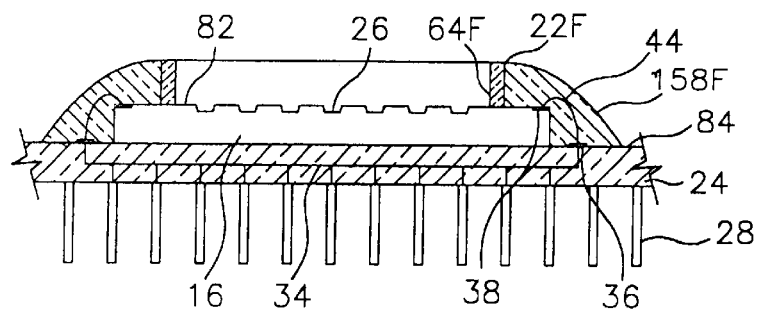
FIGS. 18A–18D are schematic cross sectional views illustrating alternate embodiment alignment members configured to provide bond wire protection.

In FIG. 18A an alignment member 22F is a separate member attached to the interconnect 16. The alignment member 22F resembles a picture frame, and includes an alignment opening 64F that has an outline slightly larger than the outline of the component 10D, 10CSP or 10W being testing (e.g., 1 to several mils larger). The alignment member 22F can be formed separately out of a suitable material such as plastic, ceramic or metal. In addition, the alignment member 22F can include features such as pins, or etched pedestals (not shown), that mate with corresponding features, such as pockets (not shown) in the interconnect 16 to provide alignment during assembly. The alignment member 22F can be attached to the interconnect 16 using a suitable adhesive such as silicone. The alignment member 22F also includes an encapsulant 158F that encapsulates and protects the bond wires 44 formed between the bonding pads 38 on the interconnect 16 and the bonding pads 36 on the base 24. The encapsulant 158F can comprise a curable polymer, such as epoxy or silicone, that is deposited as a "glob top" in viscous form, and then cured as required.

Figure 18B:
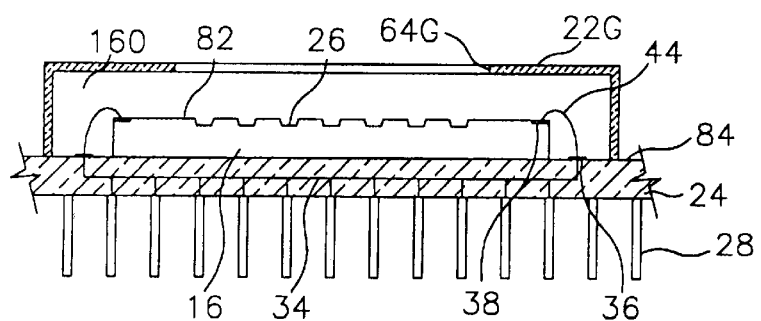

In FIG. 18B, an alignment member 22G is a separate member that is attached to the base 24. The alignment member 22G includes an alignment opening 64G that has an outline which substantially matches, but is slightly larger, than the outline of the component 10D, 10CSP or 10W being tested (e.g., 1 to several mils larger). In addition the alignment member 22G has a cross sectional configuration that forms a substantially enclosed space 160 which encloses and protects the bond wires 44. The alignment member 22G can be described as an open topped cover, which encloses the interconnect 16, and a portion of the base 24 surrounding a periphery of the interconnect 16.

Figure 18C:
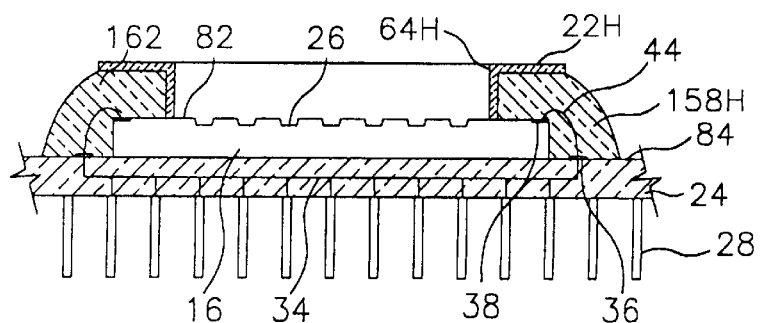

In FIG. 18C, an alignment member 22H is a separate member that is attached to the base 24. The alignment member 22H includes an alignment opening 64H that has an outline which substantially matches, but is slightly larger, than the outline of the component 10D, 10CSP or 10W being tested (e.g., 1 to several mils larger). In addition, the alignment member 22H has a right angle cross sectional configuration, that forms an enclosed space 162 for enclosing and protecting the bond wires 44. This cross sectional configuration includes open ends that permit an encapsulant 22H to be placed between the alignment member 22H and the base 24 to encapsulate and protect the bond wires 44.

Figure 18D:
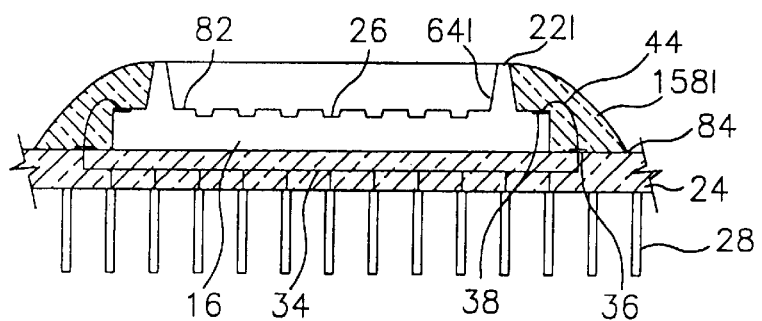

In FIG. 18D, an alignment member 22I is formed integrally with the interconnect 16 using an etching or molding process substantially as previously described for alignment opening 64D (FIG. 10C). The alignment member 22I includes an alignment opening 64I that has an outline which substantially matches, but is slightly larger, than the outline of the component 10D, 10CSP or 10W being tested (e.g., 1 to several mils larger). In addition, an encapsulant 22I is formed on the interconnect 16 and base 24 to encapsulate and protect the bond wires 44.

Thus the invention provides improved test systems and alignment members for testing semiconductor components. Although the invention has been described with reference to certain preferred embodiments, as will be apparent to those skilled in the art, certain changes and modifications can be made without departing from the scope of the invention as defined by the following claims.

We claim:

1. A test system for testing a semiconductor component having a plurality of component contacts comprising:
   a base comprising a plurality of terminal contacts;
   an interconnect on the base comprising a plurality of interconnect contacts in electrical communication with the terminal contacts and configured to electrically engage the component contacts;
   a plurality of wires and wire bonds electrically connecting the interconnect contacts to the terminal contacts, with at least some of the wires and the wire bonds comprising dummies;
   an encapsulant encapsulating the wires and the wire bonds, the dummies preventing the encapsulant from contacting selected portions of the interconnect or the base;
   a ridge on the interconnect configured to prevent the encapsulant from contacting the selected portions of the interconnect; and
   an alignment member on the interconnect or the base configured to align the component to the interconnect.

2. The test system of claim 1 wherein the ridge comprises a portion of the interconnect or a deposited polymer.

3. The test system of claim 1 wherein the alignment member comprises a separate element attached to the interconnect.

4. The test system of claim 1 wherein the alignment member includes at least one alignment mark configured to align the alignment member on the interconnect.

5. The test system of claim 1 wherein the component comprises an element selected from the group consisting of semiconductor wafers, semiconductors dice, semiconductor packages, chip scale packages, wafers containing semiconductor packages, panels containing semiconductor packages, boards containing semiconductor dice, and electronic assemblies containing semiconductor dice.

6. A test system for testing a semiconductor component having a plurality of component contacts comprising:
   a base comprising a plurality of terminal contacts configured for electrical communication with a test circuitry and a plurality of base bond pads in electrical communication with terminal contacts;
   an interconnect on the base comprising a plurality of interconnect contacts configured to electrically engage the component contacts and a plurality of interconnect bond pads in electrical communication with the interconnect contacts;

a plurality of wires bonded to the base bond pads and to the interconnect bond pads configured to electrically connect the terminal contacts to the interconnect contacts, with at least some of the wires configured as dummy wires;

an alignment member on the interconnect comprising an alignment opening configured to align the component to the interconnect;

an encapsulant on the interconnect proximate to the alignment member at least partially enclosing and protecting the wires and with the dummy wires confining the encapsulant to selected areas on the base and the interconnect; and at least one dam on the interconnect configured to prevent the encapsulant from contacting the alignment member.

7. The test system of claim 6 wherein the dam comprises a polymer material deposited on the interconnect.

8. The test system of claim 6 wherein the alignment member comprises a separate element attached to the interconnect.

9. The test system of claim 6 wherein the alignment member comprises an etched or a molded structure formed integrally with the interconnect.

10. The test system of claim 6 wherein the dam comprise a ridge, a pedestal or a recess formed integrally with the interconnect.

11. A test system for testing a semiconductor component having a plurality of component contacts comprising:

a base comprising a plurality of terminal contacts;

an interconnect on the base comprising a dam, a plurality of interconnect contacts in electrical communication with the terminal contacts configured to electrically engage the component contacts, and an alignment member configured to align the component to the interconnect;

a plurality of wires bonded to the base and to the interconnect electrically connecting the interconnect contacts to the terminal contacts with at least some of the wires configured as dummy wires; and an encapsulant comprising a polymer encapsulating the wires;

the dummy wires and the dam configured to prevent the polymer from contacting selected areas on the interconnect and the base.

12. The test system of claim 11 wherein the alignment member includes at least one alignment mark for aligning the alignment member on the interconnect.

13. The test system of claim 11 wherein the alignment member comprises a deposited polymer.

14. The test system of claim 11 wherein the interconnect and the base include dummy bond pads for the dummy wires.

15. A test system for testing a semiconductor component having a plurality of component contacts comprising:

a base comprising a plurality of base bond pads;

an interconnect on the base comprising a substrate, a plurality of interconnect contacts on the substrate configured to electrically engage the component contacts, and a plurality of interconnect bond pads on the substrate in electrical communication with the interconnect contacts;

an alignment member on the interconnect configured to align the component contacts to the interconnect contacts;

a plurality of wires bonded to the base bond pads and to the interconnect bond pads at least some of which are dummies;

an encapsulant comprising a cured polymer at least partially encapsulating the wires and with the dummies confining a flow of the encapsulant; and at least one dam on the interconnect comprising a portion of the substrate configured to prevent the polymer from contacting selected areas on the interconnect or the base.

16. The test system of claim 15 wherein the dummies confine the polymer during curing.

17. The test system of claim 15 wherein the dam comprises an etched ridge or an etched pedestal.

18. The test system of claim 15 wherein the dam comprises an etched recess.

19. A method for fabricating a test system for testing a semiconductor component having a plurality of component contacts comprising:

providing a base comprising a plurality of terminal contacts and a plurality of base bond pads;

providing an interconnect comprising a plurality of interconnect contacts configured to make temporary electrical connections with the component contacts, a plurality of interconnect bond pads in electrical communication with the interconnect contacts, at least one dam, and an alignment member configured to align the component;

bonding a plurality of wires to the base bond pads and to the interconnect bond pads in electrical communication with the terminal contacts and the interconnect contacts with at least some of the wires comprising dummies;

depositing a polymer on the interconnect, on the base and on the wires; and curing the polymer to encapsulate the wires with the dummies and the dam confining the polymer to a selected area of the interconnect.

20. The method of claim 19 wherein the dam comprises a polymer.

21. The method of claim 20 wherein the dam comprises a ridge, a pedestal or a recess etched or deposited on the interconnect.

* * * * *